(12) United States Patent
Yamato

(10) Patent No.: US 6,495,888 B1
(45) Date of Patent: Dec. 17, 2002

(54) SEMICONDUCTOR DEVICE WITH P-N JUNCTION DIODE AND METHOD OF FORMING THE SAME

(75) Inventor: Hidekazu Yamato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/653,361

(22) Filed: Aug. 31, 2000

(30) Foreign Application Priority Data

Sep. 2, 1999 (JP) .......................................... 11-248588

(51) Int. Cl.⁷ .......................... H01L 29/76; H01L 29/00
(52) U.S. Cl. ........................ 257/355; 257/356; 257/360; 257/546; 257/328; 257/342; 257/339
(58) Field of Search ................... 257/355, 356, 257/360, 546, 328, 342, 339

(56) References Cited

U.S. PATENT DOCUMENTS

| | | | | |
|---|---|---|---|---|
| 5,162,966 A | * | 11/1992 | Fujihira ....................... | 257/140 |
| 5,561,313 A | * | 10/1996 | Saitoh et al. ................ | 257/360 |
| 5,986,308 A | * | 11/1999 | Gradenwitz ................. | 257/362 |
| 6,022,769 A | * | 2/2000 | Wu ............................. | 438/200 |
| 6,144,065 A | * | 11/2000 | Kinzer ........................ | 257/327 |

FOREIGN PATENT DOCUMENTS

| | | | |
|---|---|---|---|
| EP | 0564698 A1 | * | 6/1993 |
| JP | B2 3-34565 | | 5/1991 |
| JP | A 9-260507 | | 10/1997 |

* cited by examiner

Primary Examiner—Eddie Lee
Assistant Examiner—Joseph Nguyen
(74) Attorney, Agent, or Firm—Young & Thompson

(57) ABSTRACT

The present invention provides a semiconductor device having: a first semiconductor region of a first conductivity type having a first area and a second area; at least a diffusion region of a second conductivity type being provided on the first area and in an upper region of the first semiconductor region; and a p-n junction diode provided on the second area of the first semiconductor regions the p-n junction diode having a p-n junction comprising an interface between the first semiconductor region and a first impurity doped region of the second conductivity type selectively provided in an upper region of the first semiconductor region, wherein a first distance defined between a first bottom level of the first impurity doped region and a bottom level of the first semiconductor region is smaller than a second distance defined between a second bottom level of the at least diffusion region and the bottom level of the first semiconductor region.

10 Claims, 28 Drawing Sheets

SEMICONDUCTOR DEVICE WITH P-N JUNCTION DIODE AND METHOD OF FORMING THE SAME

BACKGROUND OF THE INVENTION

The present invention relates to a semiconductor device provided with a p-n junction diode and a method of forming the same, and more particularly to a semiconductor device having both a metal oxide semiconductor field effect transistor and a p-n junction diode for protecting the transistor.

The semiconductor device having the MOS field effect transistor is provided with a p-n junction diode for preventing the MOS field effect transistor particularly a gate insulation film from being broken due to electrostatic discharge or a surge current and a surge voltage. It had been known that this semiconductor device is fabricated as follows. FIGS. 1A and 1B are fragmentary cross sectional elevation views illustrative of a semiconductor device provided with both a metal oxide semiconductor: field effect transistor and a p-n junction diode in sequential steps involved in the conventional fabrication method. The semiconductor device has a metal oxide semiconductor field effect transistor region 121 and a p-n junction diode region 122.

With reference to FIG. 1A, an n+-type epitaxial layer 102 is formed on a top surface of a silicon substrate 101. An n−-type well region 103 is selectively formed in an upper region of the n+-type epitaxial layer 102. Device isolation layers 106 are selectively formed in upper regions of the n−-type well region 103 so that the device isolation layers 106 define both a metal oxide semiconductor field effect transistor region 121 and a p-n junction diode region 122. The metal oxide semiconductor field effect transistor region 121 comprises a part of the n-type well region 103 surrounded by the device isolation layers 106. The p-n junction diode region 122 also comprises another part of the n−-type well region 103 surrounded by the device isolation layers 106.

In the metal oxide semiconductor field effect transistor region 121, a gate insulation film 108 is selectively provided on the top surface of the n−-type well region 103. A gate electrode 107 is provided on the gate insulation film 108. A pair of p−-type lightly doped diffusion regions 113a and 113b are selectively formed in upper regions of the n−-type well region 103 by a self-alignment technique. Side wall insulation films 105a and 105b are formed on side walls of the gate electrode 107.

With reference to FIG. 1B, an ion-implantation process is then carried out by use of the gate electrode 107 and the side wall insulation films 105a and 105b as masks for selectively introducing a p-type impurity into both the metal oxide semiconductor field effect transistor region 121 and the p-n junction diode region 122. As a result, in the metal oxide semiconductor field effect transistor region 121, source and drain p+-type diffusion regions 104a and 104b are selectively formed in the n−-type well region 103 so that the source and drain p+-type diffusion regions 104a and 104b are self-aligned to the gate electrode 107 and the side wall insulation films 105a and 105b, whereby lightly doped diffusion regions 113a and 113b remain only under the side wall insulation films 105a and 105b. The source and drain p+-type diffusion regions 104a and 104b are deeper than the lightly doped diffusion regions 113a and 113b. Concurrently, in the p-n junction diode region 122, a p+-type region 104c is selectively formed in the n−-type well region 103. The p+-type region 104c is defined by the device isolation layers 6. The p+-type region 104c has the same depth as the source and drain p+-type diffusion regions 104a and 104b. In the metal oxide semiconductor field effect transistor region 121, a source region comprises the p+-type diffusion region 104a and the lightly doped-diffusion region 113a, whilst a drain region comprises the p+-type diffusion region 104b and the lightly doped diffusion region 113b. In the p-n junction diode region 122, the p+-type region 104c and the n−-type well region 103 form a p-n junction diode which has a p-n junction formed on an interface between the p+-type region 104c and the n−-type well region 103.

Even illustrative is omitted, an inter-layer insulator is further formed entirely which extends over both the metal oxide semiconductor field effect transistor region 121 and the p-n junction diode region 122. The inter-layer insulator not illustrated extends over the device isolation layers 106, the side wall insulation films 105, the gate electrode 107 and the source and drain p+-type diffusion regions 104a and 104b as well as over the p$^+$-type region 104c. Contact holes not illustrated are formed in the inter-layer insulator so that the contact holes reach the gate electrode 107 and the source and drain p$^+$-type diffusion regions 104a and 104b as well as the p$^+$-type region 104c respectively. Metal plugs and metal interconnections not illustrated are formed, wherein the metal plugs are formed in the contact holes so that the metal plugs are in contact with the gate electrode 107 and the source and drain p$^+$-type diffusion regions 104a and 104b as well as the p$^+$-type region 104c, whilst the metal interconnections extend over the inter-layer insulator whereby the metal interconnections are electrically connected through the metal plugs in the contact holes to the gate electrode 107 and the source and drain p$^+$-type diffusion regions 104a and 104b as well as the p$^+$-type region 104c.

In accordance with the conventional method of forming the semiconductor device, a distance "d" of the p-n junction of the diode or the interface between the p+-type region 104c and the n−-type well region 103 from a bottom of the n−-type well region 103 or an interface between the n−-type well region 103 and the n+-type epitaxial layer 102 depends on a difference of a depth of the n−-type well region 103 from a depth of the p+-type region 104c. The p+-type region 104c serves as an anode of the p-n junction diode. The p+-type region 104c is formed in the p-n junction diode region 122 by the same ion-implantation process for forming the source and drain p+-type diffusion regions 104a and 104b in the metal oxide semiconductor field effect transistor region 121. Namely, the depth of the p+-type region 104c in the p-n junction diode region 122 is the same as the depth of the source and drain p+-type diffusion regions 104a and 104b in the metal oxide semiconductor field effect transistor region 121. The depth of the p+-type region 104c in the p-n junction diode region 122 is decided by the depth of the source and drain p+-type diffusion regions 104a and 104b in the metal oxide semiconductor field effect transistor region 121. The depth of the source and drain p+-type diffusion regions 104a and 104b and the depth of the n−-type well region 103 are also decided in consideration of the required dimensions and performances of the metal oxide semiconductor field effect transistor formed in the metal oxide semiconductor field effect transistor region 121. Namely, the distance "d" in the p-n junction diode region 122 is decided depending upon the required dimensions and performances of the metal oxide semiconductor field effect transistor formed in the metal oxide semiconductor field effect transistor region 121. A breakdown voltage of the p-n junction diode formed between the p+-type region 104c and the n−-type well region 103 depends upon the distance "d" in the p-n junction diode region 122. Namely, the breakdown voltage of the p-n junction diode in the p-n junction diode region 122 is decided depending upon the required dimensions and performances of the metal oxide semiconductor field effect transistor formed in the metal oxide semiconductor field effect transistor region 121. Normally, the depth of the n⁻-type well region 103 is about 900 nanometers, whilst the depth of the source and drain p+-type diffusion regions 104a and 104b and the p+-type region 104c is about 300 nanometers. The distance "d" is large, for example, about 600 nanometers. The large distance "d" causes the high breakdown voltage of the diode in the p-n junction diode region 122. The reason why the p-n junction diode is formed in the p-n junction diode region 122 is to cause a breakdown of the p-n junction diode so as to prevent the metal oxide semiconductor field effect transistor from being broken due to the electrostatic discharge or the surge current and voltage. If the breakdown voltage of the p-n junction diode formed in the p-n junction diode region 122 is high as the prior art, then this allows that the p-n junction diode shows no breakdown and in place the metal oxide semiconductor field effect transistor is broken by the electrostatic discharge or the surge current and voltage applications.

In the above circumstances, it had been required to develop a novel semiconductor device having a metal oxide semiconductor field effect transistor and a p-n junction diode free from the above problem.

SUMMARY OF THE INVENTION

Accordingly, it is an object of the present invention to provide a novel semiconductor device having a metal oxide semiconductor field effect transistor and a p-n junction diode free from the above problems.

It is a further object of the present invention to provide a novel semiconductor device having a metal oxide semiconductor field effect transistor and a p-n junction diode which has a reduced breakdown voltage.

It is a still further object of the present invention to provide a novel semiconductor device having a metal oxide semiconductor field effect transistor and a p-n junction diode which has a high capability of preventing the metal oxide semiconductor field effect transistor from being broken due to the electrostatic discharge or the surge current and voltage applications.

It is yet a further object of the present invention to provide a novel method of forming a semiconductor device having a metal oxide semiconductor field effect transistor and a p-n junction diode free from the above problems.

It is further more object of the present invention to provide a novel method of forming a semiconductor device having a metal oxide semiconductor field effect transistor and a p-n junction diode which has a reduced breakdown voltage.

It is moreover object of the present invention to provide a novel method of forming a semiconductor device having a metal oxide semiconductor field effect transistor and a p-n junction diode which, has a high capability of preventing the metal oxide semiconductor field effect transistor from being broken due to the electrostatic discharge or the surge current and voltage applications.

It is yet more object of the present invention to provide a novel method of forming a semiconductor device having a metal oxide semiconductor field effect transistor and a p-n junction diode which has a controllable breakdown voltage.

The present invention provides a semiconductor device having: a first semiconductor region of a first conductivity type having a first area and a second area; at least a diffusion region of a second conductivity type being provided on the first area and in an upper region of the first semiconductor region; and a p-n junction diode provided on the second area of the first semiconductor region, the p-n junction diode having a p-n junction comprising an interface between the first semiconductor region and a first impurity doped region of the second conductivity type selectively provided in an upper region of the first semiconductor region, wherein a first distance defined between a first bottom level of the first impurity doped region and a bottom level of the first semiconductor region is smaller than a second distance defined between a second bottom level of the at least diffusion region and the bottom level of the first semiconductor region.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
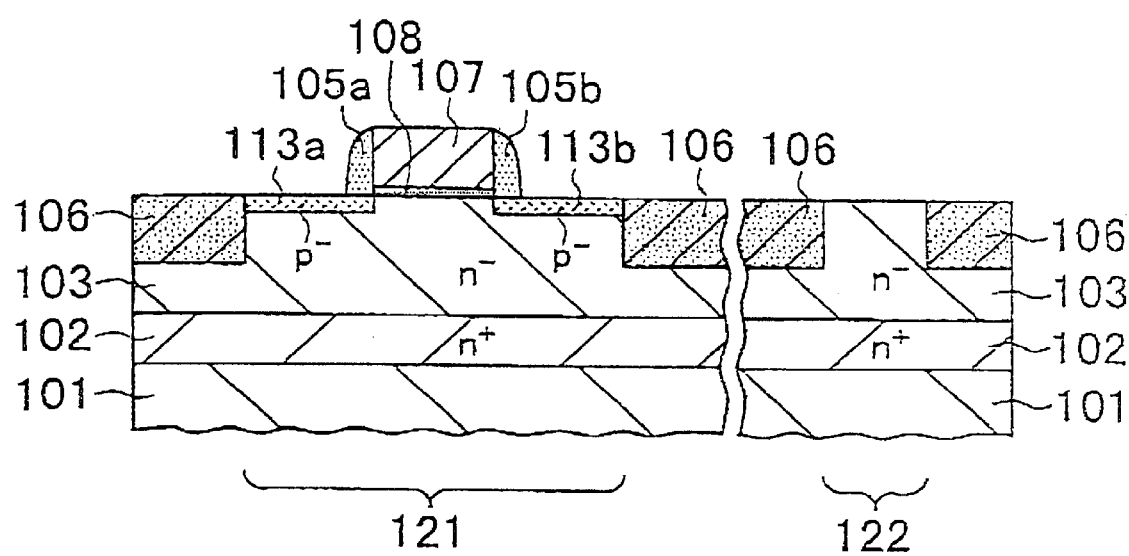
FIGS. 1A and 1B are fragmentary cross sectional elevation views illustrative of a semiconductor device provided with both a metal oxide semiconductor field effect transistor and a p-n junction diode in sequential steps involved in the conventional fabrication method.
Figure 1B:
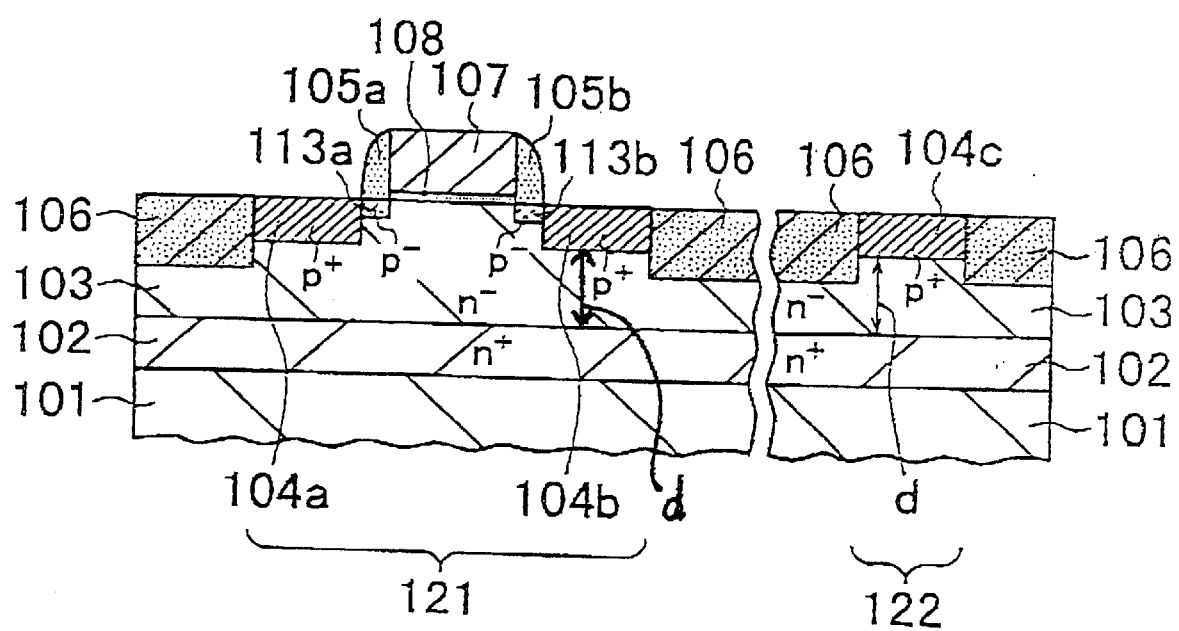

The first present invention provides a semiconductor device having: a first semiconductor region of a first conductivity type having a first area and a second area; at least a diffusion region of a second conductivity type being provided on the first area and in an upper region of the first semiconductor region and a p-n junction diode provided on the second area of the first semiconductor region, the pen junction diode having a p-n junction comprising an interface between the first semiconductor region and a first impurity doped region of the second conductivity type selectively provided in an upper region of the first semiconductor region, wherein a first distance defined between a first bottom level of the first impurity doped region and a bottom level of the first semiconductor region is smaller than a second distance defined between a second bottom level of the at least diffusion region and the bottom level of the first semiconductor region.

It is preferable that the first impurity doped region of the p-n junction diode is self-aligned to and exists directly under a first contact hole penetrating a device isolation layer, so that a top level of the first impurity doped region corresponds to a third bottom level of the device isolation layer and which is deeper than the second bottom level of the at least diffusion region and shallower than the first bottom level of the first impurity doped region.

It is further preferable that the first impurity doped region of the p-n junction diode has a first thickness which is thinner than a second thickness of the at least diffusion region.

It is further more preferable that at least a second contact hole is further provided directly over a part of the at least diffusion region and a second impurity doped region is selectively provided in the at least diffusion region and is self-aligned to and exists directly under the second contact hole.

It is moreover preferable that the second impurity doped regions has substantially the same thickness as the first thickness of the first impurity doped region of the p-n junction diode.

It is also preferable that an inter-layer insulator exists over the field effect transistor on the first area and the device isolation layer over the p-n junction diode on the second area, and the second contact hole penetrates the inter-layer insulator, whilst the first contact hole penetrates not only the inter-layer insulator but also the device isolation layer.

It is also preferable that the first and second impurity doped regions comprise ion-implanted regions.

It is also preferable that the first impurity doped region is lower in impurity concentration than the second impurity doped region.

It is also preferable that the first semiconductor region comprises a semiconductor well region provided over a semiconductor epitaxial layer of the first conductivity type extending over a semiconductor substrate.

It is further preferable that the semiconductor well region is lower in impurity concentration than the semiconductor epitaxial layer.

As described above, in accordance with the first present invention, the bottom level of the device isolation layer is deeper than the bottom level of the diffusion region. The third impurity doped region is positioned directly under the second contact hole. The bottom level of the device isolation layer corresponds to the top level of the third impurity doped region. The bottom level of the third impurity doped region is thus deeper than the bottom level of the device isolation layer. Therefore, the bottom level of the third impurity doped region is thus deeper than the bottom level of the at least diffusion region. The bottom level of the first semiconductor layer is uniform over the first and second areas. Therefore, a first distance defined between the p-n junction of the p-n junction diode or the interface between the third impurity doped region and the bottom of the first semiconductor layer is smaller than a second distance defined between the bottom of the at least diffusion region and the bottom of the first semiconductor layer.

In accordance with the novel method of forming the semiconductor device, the first distance defined between the p-n junction of the p-n junction diode or the interface between the third impurity doped region and the bottom of the first semiconductor layer depends upon not only the thicknesses of the third impurity doped region and the first semiconductor layer but also the thickness or the depth of the device isolation layer. The third impurity doped region serves as an anode of the p-n junction diode. Namely, the depth of the p-n junction of the p-n junction diode or the bottom level of the third impurity doped region in the p-n junction diode region or the second area may be decided upon the depth of the bottom level of the device isolation layer or the thickness of the device isolation layer independently from the depth of the at least diffusion region in the semiconductor device region such as the metal oxide semiconductor field effect transistor region or the first area. The depth of the at least diffusion region and the depth of the first semiconductor layer are decided in consideration of the required dimensions and performances of the semiconductor device such as the semiconductor device such as the metal oxide semiconductor field effect transistor formed in the first area such as the metal oxide semiconductor field effect transistor region. However, the first distance "d" in the p-n junction diode region or the second area may be decided independently from the required dimensions and performances of the semiconductor device such as the metal oxide semiconductor field effect transistor formed in the first area such as the metal oxide semiconductor field effect transistor region. A breakdown voltage of the p-n junction diode formed between the third impurity doped region and the first semiconductor layer depends upon the first distance "d" in the p-n junction diode region or the second area. Namely, the breakdown voltage of the p-n junction diode in the p-n junction diode region or the second area may be decided independent from the required dimensions and performances of the semiconductor device such as the metal oxide semiconductor field effect transistor formed in the first area such as the metal oxide semiconductor field effect transistor region. Since the first distance "d" in the p-n junction diode region or the second area is adjustable by controlling the thickness of the device isolation layer independently from the requirement for designing the semiconductor device such as the metal oxide semiconductor field effect transistor. Namely, the first distance "d" in the p-n junction diode region ot the second area may be reduced for sufficiently reducing the breakdown voltage of the p-n junction diode in the p-n junction diode region or the second area independently from the requirement for designing the semiconductor device such as the metal oxide semiconductor field effect transistor. The reason why the p-n junction diode is formed in the p-n junction diode region or the second area is to cause a breakdown of the p-n junction diode so as to prevent the semiconductor device such as the metal oxide semiconductor field effect transistor from being broken due to the electrostatic discharge or the surge current and voltage. Since the breakdown voltage of the p-n junction diode formed in the p-n junction diode region or the second area is reduced, then this allows that the p-n junction diode shows a certain breakdown to prevent the semiconductor device such as the metal oxide semiconductor field effect transistor from being broken by the electrostatic discharge or the surge current and voltage applications.

The second present invention provides a semiconductor device having: a first semiconductor region of a first conductivity type having a first area and a second area; a field effect transistor provided on the first area of the first semiconductor region, the field effect transistor also having source and drain diffusion regions of a second conductivity type, the source and drain diffusion regions being provided in upper regions of the first semiconductor region; and a p-n junction diode provided on the second area of the first semiconductor region, the p-n junction diode having a p-n junction comprising an interface between the first semiconductor region and a first impurity doped region of the second conductivity type selectively provided in an upper region of the first semiconductor region, wherein a bottom first level of the first impurity doped region is deeper than a bottom second level of the source and drain diffusion regions.

It is preferable that the first impurity doped region of the p-n junction diode is self-aligned to and exists directly under a first contact hole penetrating a device isolation layer, so that a top level of the first impurity doped region corresponds to a third bottom level of the device isolation layer and which is deeper than the second bottom level of the source and drain diffusion regions and shallower than the first bottom level of the first impurity doped region.

It is further preferable that the first impurity doped region of the p-n junction diode has a first thickness which is thinner than a second thickness of the source and drain diffusion regions.

It is further more preferable that second and third contact holes are further provided directly over parts of the source and drain diffusion regions, and second and third impurity doped regions are selectively provided in the source and drain diffusion regions and are self-aligned to and exists directly under the second and third contact holes.

It is moreover preferable that the second and third impurity doped regions have substantially the same thickness as the first thickness of the first impurity doped region of the p-n junction diode.

It is also preferable that an inter-layer insulator exists over the field effect transistor on the first area and the device isolation layer over the p-n junction diode on the second area, and the second and third contact holes penetrate the inter-layer insulator, whilst the first contact hole penetrates not only the inter-layer insulator but also the device isolation layer.

It is also preferable that the first, second and third impurity doped regions comprise ion-implanted regions.

It is also preferable that the first impurity doped region is lower in impurity concentration than the second and third impurity doped regions.

It is also preferable that the first semiconductor region comprises a semiconductor well region provided over a semiconductor epitaxial layer of the first conductivity type extending over a semiconductor substrate.

It is further preferable that the semiconductor well region is lower in impurity concentration than the semiconductor epitaxial layer.

As described above, in accordance with the second present invention, the bottom level of the device isolation layer is deeper than the bottom level of the diffusion region. The third impurity doped region is positioned directly under the second contact hole. The bottom level of the device isolation layer corresponds to the top level of the third impurity doped region. The bottom level of the third impurity doped region, is thus deeper than the bottom level of the device isolation layer. Therefore, the bottom level of the third impurity doped region is thus deeper than the bottom level of the at least diffusion region. The bottom level of the first semiconductor layer is uniform over the first and second areas. Therefore, a first distance defined between the p-n junction of the p-n junction diode or the interface between the third impurity doped region and the bottom of the first semiconductor layer is smaller than a second distance defined between the bottom of the at least diffusion region and the bottom of the first semiconductor layer.

In accordance with the novel method of forming the semiconductor device, the first distance defined between the p-n junction of the p-n junction diode or the interface between the third impurity doped region and the bottom of the first semiconductor layer depends upon not only the thicknesses of the third impurity doped region and the first semiconductor layer but also the thickness or the depth of the device isolation layer. The third impurity doped region serves as an anode of the p-n junction diode. Namely, the depth of the p-n junction of the p-n junction diode or the bottom level of the third impurity doped region in the p-n junction diode region or the second area may be decided upon the depth of the bottom level of the device isolation layer or the thickness of the device isolation layer independently from the depth of the at least diffusion region in the semiconductor device region such as the metal oxide semiconductor field effect transistor region or the first area. The depth of the at least diffusion region and the depth of the first semiconductor layer are decided in consideration of the required dimensions and performances of the semiconductor device such as the semiconductor device such as the metal oxide semiconductor field effect transistor formed in the first area such as the metal oxide semiconductor field effect transistor region However, the first distance "d" in the p-n junction diode region or the second area may be decided independently from the required dimensions and performances of the semiconductor device such as the metal oxide semiconductor field effect transistor formed in the first area such as the metal oxide semiconductor field effect transistor region. A breakdown voltage of the p-n junction diode formed between the third impurity doped region and the first semiconductor layer depends upon the first distance "d" in the p-n junction diode region or the second area. Namely, the breakdown voltage of the p-n junction diode in the p-n junction diode region or the second area may be decided independent from the required dimensions and performances of the semiconductor device such as the metal oxide semiconductor field effect transistor formed in the first area such as the metal oxide semiconductor field effect transistor region. Since the first distance "d" in the p-n junction diode region or the second area is adjustable by controlling the thickness of the device isolation layer independently from the requirement for designing the semiconductor device such as the metal oxide semiconductor field effect transistor. Namely, the first distance "d" in the p-n junction diode region or the second area may he reduced for sufficiently reducing the breakdown voltage of the p-n junction diode in the p-n junction diode region or the second area independently from the requirement for designing the semiconductor device such as the metal oxide semiconductor field effect transistor. The reason why the p-n junction diode is formed in the p-n junction diode region or the second area is to cause a breakdown of the p-n junction diode so as to prevent the semiconductor device such as the metal oxide semiconductor field effect transistor from being broken due to the electrostatic discharge or the surge current and voltage. Since the breakdown voltage of the p-n junction diode formed in the p-n junction diode region or the second area is reduced, then this allows that the p-n junction diode shows a certain breakdown to prevent the semiconductor device such as the metal oxide semiconductor field effect transistor from being broken by the electrostatic discharge or the surge current and voltage applications.

The third present invention provides a method of forming a semiconductor device, comprising the steps of: selectively forming device isolation layers in upper regions of a first semiconductor region of a first conductivity type, whereby a first area of the first semiconductor region is defined by the device isolation layers selectively; forming at least a diffusion region of a second conductivity type in the first area and in an upper region of the first semiconductor region, so that the at least diffusion region has a bottom level shallower than a bottom level of the device isolation layers; forming an inter-layer insulator extending over the at least diffusion region and the device isolation region; carrying out an anisotropic etching process by use of a resist mask for forming at least a first contact hole which penetrates the inter-layer insulator and reaches a top surface of the at least diffusion region and also forming a second contact hole which penetrates both the inter-layer insulator and the device isolation layer and reaches a top surface of the first semiconductor region, whereby a second area of the first semiconductor region is defined to be self-aligned to the second contact hole; removing the resist mask; and carrying out an ion-implantation by use of the inter-layer insulator having the at least first contact hole and the second contact hole as a mask for selectively introducing a second conductivity type impurity into an upper region of the at least diffusion region through the at least first contact hole and also into an upper region of the first semiconductor region through the second contact hole, whereby a first impurity doped region of the second conductivity type is selectively formed in the upper region of the first semiconductor region and is self-aligned to the second contact hole thereby forming a p-n junction diode having a p-n junction comprising an interface between the first semiconductor region and the first impurity doped region, whilst at least a second impurity doped region of the second conductivity type is also selectively formed in the upper region of the at least diffusion region and is self-aligned to the at least first contact hole, wherein a top level of the first impurity doped region corresponds to a bottom level of the device isolation layer and which is deeper than a bottom level of the at least diffusion region and shallower than a bottom level of the first impurity doped region, and a first distance defined between the bottom level of the first impurity doped region and a bottom level of the first semiconductor region is smaller than a second distance declined between the bottom level of the at least diffusion region and the bottom level of the first semiconductor region.

As described above, in accordance with the third present invention, the bottom level of the device isolation layer is deeper than the bottom level of the diffusion region. The third impurity doped region is positioned directly under the second contact hole. The bottom level of the device isolation layer corresponds to the top level of the third impurity doped region. The bottom level of the third impurity doped region is thus deeper than the bottom level of the device isolation layer. Therefore, the bottom level of the third impurity doped region is thus deeper than the bottom level of the at least diffusion region. The bottom level of the first semiconductor layer is uniform over the first and second areas. Therefore, a first distance defined between the p-n junction of the p-n junction diode or the interface between the third impurity doped region and the bottom of the first semiconductor layer is smaller than a second distance defined, between the bottom of the at least diffusion region and the bottom of the first semiconductor layer.

In accordance with the novel method of forming the semiconductor device, the first distance defined between the p-n junction of the p-n junction diode or the interface between the third impurity doped region and the bottom of the first semiconductor layer depends upon not only the thicknesses of the third impurity doped region and the first semiconductor layer but also the thickness or the depth of the device isolation layer. The third impurity doped region serves as an anode of the p-n junction diode. Namely, the depth of the p-n junction of the p-n junction diode or the bottom level of the third impurity doped region in the p-n junction diode region or the second area may be decided upon the depth of the bottom level of the device isolation layer or the thickness of the device isolation layer independently from the depth of the at least diffusion region in the semiconductor device region such as the metal oxide semiconductor field effect transistor region or the first area. The depth of the at least diffusion region and the depth of the first semiconductor layer are decided in consideration of the required dimensions and performances of the semiconductor device such as the semiconductor device such as the metal oxide semiconductor field effect transistor formed in the first area such as the metal oxide semiconductor field effect transistor region. However, the first distance "d" in the p-n junction diode region or the second area may be decided independently from the required dimensions and performances of the semiconductor device such as the metal oxide semiconductor field effect transistor formed in the first area such as the metal oxide semiconductor field effect transistor region. A breakdown voltage of the p-n junction diode formed between the third impurity doped region and the first semiconductor layer depends upon the first distance "d" in the p-n junction diode region or the second area. Namely, the breakdown voltage of the p-n junction diode in the p-n junction diode region or the second area may be decided independent from the required dimensions and performances of the semiconductor device such as the metal oxide semiconductor field effect transistor formed in the first area such as the metal oxide semiconductor field effect transistor region. Since the first distance "d" in the p-n junction diode region or the second area is adjustable by controlling the thickness of the device isolation layer independently from the requirement for designing the semiconductor device such as the metal oxide semiconductor field effect transistor. Namely, the first distance "d" in the p-n junction diode region or the second area may be reduced for sufficiently reducing the breakdown voltage of the p-n junction diode in the p-n junction diode region or the second area independently from the requirement for designing the semiconductor device such as the metal oxide semiconductor field effect transistor. The reason why the p-n junction diode is formed in the p-n junction diode region or the second area is to cause a breakdown of the p-n junction diode so as to prevent the semiconductor device such as the metal oxide semiconductor field effect transistor from being broken due to the electrostatic discharge or the surge current and voltage. Since the breakdown voltage of the p-n junction diode formed in the p-n junction diode region or the second area is reduced, then this allows that the p-n junction diode shows a certain breakdown to prevent the semiconductor device such as the metal oxide semiconductor field effect transistor from being broken by the electrostatic discharge or the surge current and voltage applications.

The fourth present invention provides a method of forming a semiconductor device, comprising the steps of: selectively forming device isolation layers in upper regions of a first semiconductor region of a first conductivity type, whereby a first area of the first semiconductor region is defined by the device isolation layers selectively forming at least a diffusion region of a second conductivity type in the first area and in an upper region of the first semiconductor region, so that the at least diffusion region has a bottom level shallower than a bottom level of the device isolation layers; forming an inter-layer insulator extending over the at least diffusion region and the device isolation region; carrying out an anisotropic etching process by use of a resist mask for forming at least a first contact hole which penetrates the inter-layer insulator and reaches a top surface of the at least diffusion region and also forming a second contact hole which penetrates both the inter-layer insulator and the device isolation layer and reaches a top surface of the first semiconductor region, whereby a second area of the first semiconductor region is defined to be self-aligned to the second contact hole; and carrying out an ion-implantation by use of the resist mask for selectively introducing a second conductivity type impurity into an upper region of the at least diffusion region through the at least first contact hole and also into an upper region of the first semiconductor region through the second contact hole, whereby a first impurity doped region of the second conductivity type is selectively formed in the upper region of the first semiconductor region and is self-aligned to the second contact hole thereby forming a p-n junction diode having a p-n junction comprising an interface between the first semiconductor region and the first impurity doped region, whilst at least a second impurity doped region of the second conductivity type is also selectively formed in the upper region of the at least diffusion region and is self-aligned to the at least first contact hole, wherein a top level of the first impurity doped region corresponds to a bottom level of the device isolation layer and which is deeper than a bottom level of the at least diffusion region and shallower than a bottom level of the first impurity doped region, and a first distance defined between the bottom level of the first impurity doped region and a bottom level of the first semiconductor region is smaller than a second distance defined between the bottom level of the at least diffusion region and the bottom level of the first semiconductor region.

As described above, in accordance with the fourth present invention, the bottom level of the device isolation layer is deeper than the bottom level of the diffusion region. The third impurity doped region is positioned directly under the second contact hole. The bottom level of the device isolation layer corresponds to the top level of the third impurity doped region. The bottom level of the third impurity doped region is thus deeper than the bottom level of the device isolation layer. Therefore, the bottom level of the third impurity doped region is thus deeper than the bottom level of the at least diffusion region. The bottom level of the first semiconductor layer is uniform over the first and second areas. Therefore, a first distance defined between the p-n junction of the p-n junction diode or the interface between the third impurity doped region and the bottom of the first semiconductor layer is smaller than a second distance defined between the bottom of the at least diffusion region and the bottom of the first semiconductor layer.

In accordance with the novel method of forming the semiconductor device, the first distance defined between the p-n junction of the p-n junction diode or the interface between the third impurity doped region and the bottom of the first semiconductor layer depends upon not only the thicknesses of the third impurity doped region and the first semiconductor layer but also the thickness or the depth of the device isolation layer. The third impurity doped region serves as an anode of the p-n junction diode. Namely, the depth of the p-n junction of the p-n junction diode or the bottom level of the third impurity doped region in the p-n junction diode region or the second area may be decided upon the depth of the bottom level of the device isolation layer or the thickness of the device isolation layer independently from the depth of the at least diffusion region in the semiconductor device region such as the metal oxide semiconductor field effect transistor region or the first area. The depth of the at least diffusion region and the depth of the first semiconductor layer are decided in consideration of the required dimensions and performances of the semiconductor device such as the semiconductor device such as the metal oxide semiconductor field effect transistor formed in the first area such as the metal oxide semiconductor field effect transistor region. However, the first distance "d" in the p-n junction diode region or the second area may be decided independently from the required dimensions and performances of the semiconductor device such as the metal oxide semiconductor field effect transistor formed in the first area such as the metal oxide semiconductor field effect transistor region. A breakdown voltage of the p-n junction diode formed between the third impurity doped region and the first semiconductor layer depends upon the first distance "d" in the p-n junction diode region or the second area. Namely, the breakdown voltage of the p-n junction diode in the p-n junction diode region or the second area may be decided independent from the required dimensions and performances of the semiconductor device such as the metal oxide semiconductor field effect transistor formed in the first area such as the metal oxide semiconductor field effect transistor region. Since the first distance "d" in the p-n junction diode region or the second area is adjustable by controlling the thickness of the device isolation layer independently from the requirement for designing the semiconductor device such as the metal oxide semiconductor field effect transistor. Namely, the first distance "d" in the p-n junction diode region or the second area may be reduced for sufficiently reducing the breakdown voltage of the p-n junction diode in the p-n junction diode region or the second area independently from the requirement for designing the semiconductor device such as the metal oxide semiconductor field effect transistor. The reason why the p-n junction diode is formed in the p-n junction diode region or the second area is to cause a breakdown of the p-nl junction diode so as to prevent the semiconductor device such as the metal oxide semiconductor field effect transistor from being broken due to the electrostatic discharge or the surge current and voltage. Since the breakdown voltage of the p-n junction diode formed in the p-n junction diode region or the second area is reduced, then this allows that the p-n junction diode shows a certain breakdown to prevent the semiconductor device such as the metal oxide semiconductor field effect transistor from being broken by the electrostatic discharge or the surge current and voltage applications.

The fifth present invention provides a method of forming a semiconductor device, comprising the steps of: selectively forming device isolation layers in upper regions of a first semiconductor region of a first conductivity type, whereby a first area of the first semiconductor region is defined by the device isolation layers carrying out a first anisotropic etching process by use of a first resist mask for forming a first contact hole which penetrates the device isolation layer and reaches a top surface of the first semiconductor region, whereby a second area of the first semiconductor region is defined to be self-aligned to the first contact hole; removing the first resist mask; selectively forming at least a diffusion region of a second conductivity type in the first area and in an upper region of the first semiconductor region, so that the at least diffusion region has a bottom level shallower than a bottom level of the device isolation layers forming an inter-layer insulator extending over the at least diffusion region and the device isolation region as well as in the first contact hole; carrying out a second anisotropic etching process by use of a second resist mask for forming at least a second contact bole which penetrates the inter-layer insulator and reaches a top surface of the at least diffusion region and also forming a third contact hole which penetrates the inter-layer insulator and reaches a top surface of the first semiconductor region; removing the second resist mask; and carrying out an ion-implantation by use of the inter-layer insulator having the at least first contact hole and the second contact hole as a mask for selectively introducing a second conductivity type impurity into an upper region of the at least diffusion region through the at least first contact hole and also into an upper region of the first semiconductor region through the second contact hole, whereby a first impurity doped region of the second conductivity type is selectively formed in the upper region of the first semiconductor region and is self-aligned to the second contact hole thereby forming a p-n junction diode having a p-n junction comprising an interface between the first semiconductor region and the first impurity doped region, whilst at least a second impurity doped region of the second conductivity type is also selectively formed in the upper region of the at least diffusion region and is self-aligned to the at least first contact hole, wherein a top level of the first impurity doped region corresponds to a bottom level of the device isolation layer and which is deeper than a bottom level of the at least diffusion region and shallower than a bottom level of the first impurity doped region, and a first distance defined between the bottom level of the first impurity doped region and a bottom level of the first semiconductor region is smaller than a second distance defined between the bottom level of the at least diffusion region and the bottom level of the first semiconductor region.

As described above, in accordance with the fifth present invention, the bottom level of the device isolation layer is deeper than the bottom level of the diffusion region. The third impurity doped region is positioned directly under the first contact hole or the third contact hole. The bottom level of the device isolation layer corresponds to the top level of the third impurity doped region. The bottom level of the third impurity doped region is thus deeper than the bottom level of the device isolation layer. Therefore, the bottom level of the third impurity doped region is thus deeper than the bottom level of the at least diffusion region. The bottom level of the first semiconductor layer is uniform over the first and second areas. Therefore, a first distance defined between the p-n junction of the p-n junction diode or the interface between the third impurity doped region and the bottom of the first semiconductor layer is smaller than a second distance defined between the bottom of the at least diffusion region and the bottom of the first semiconductor layer.

In accordance with the novel method of forming the semiconductor device, the first distance defined between the p-n junction of the p-n junction diode or the interface between the third impurity doped region and the bottom of the first semiconductor layer depends upon not only the thicknesses of the third impurity doped region and the first semiconductor layer but also the thickness or the depth of the device isolation layer. The third impurity doped region serves as an anode of the p-n junction diode. Namely, the depth of the p-n junction of the p-n junction diode or the bottom level of the third impurity doped region in the p-n junction. diode region or the second area may be decided upon the depth of the bottom level of the device isolation layer or the thickness of the device isolation layer independently from the depth of the at least diffusion region in the semiconductor device region such as the metal oxide semiconductor field effect transistor region or the first area. The depth of the at least diffusion region and the depth of the first semiconductor layer are decided in consideration of the required dimensions and performances of the semiconductor device such as the semiconductor device such as the metal oxide semiconductor field effect transistor formed in the first area such as the metal oxide semiconductor field effect transistor region. However, the first distance "d" in the p-n junction diode region or the second area may be decided independently from the required dimensions and performances of the semiconductor device such as the metal oxide semiconductor field effect transistor formed in the first area such as the metal oxide semiconductor field effect transistor region. A breakdown voltage of the p-n junction diode formed between the third impurity doped region and the first semiconductor layer depends upon the first distance "d" in the p-n junction diode region or the second area. Namely, the breakdown voltage of the p-n junction diode in the p-n junction diode region or the second area may be decided independent from the required dimensions and performances of the semiconductor device such as the metal oxide semiconductor field effect transistor formed in the first area such as the metal oxide semiconductor field effect transistor region. Since the first distance "d" in the p-n junction diode region or the second area is adjustable by controlling the thickness of the device isolation layer independently from the requirement for designing the semiconductor device such as the metal oxide semiconductor field effect transistor. Namely, the first distance "d" in the p-n junction diode region or the second area may be reduced for sufficiently reducing the breakdown voltage of the p-n junction diode in the p-n junction diode region or the second area independently from the requirement for designing the semiconductor device such as the metal oxide semiconductor field effect transistor. The reason why the p-n junction diode is formed in the p-n junction diode region or the second area is to cause a breakdown of the p-n junction diode so as to prevent the semiconductor device such as the metal oxide semiconductor field effect transistor from being broken due to the electrostatic discharge or the surge current and voltage. Since the breakdown voltage of the p-n junction diode formed in the p-n junction diode region or the second area is reduced, then this allows that the p-n junction diode shows a certain breakdown to prevent the semiconductor device such as the metal oxide semiconductor field effect transistor from being broken by the electrostatic discharge or the surge current and voltage applications.

The sixth present invention provides a method of forming a semiconductor device, comprising the steps of: selectively forming device isolation layers in upper regions of a first semiconductor region of a first conductivity type, whereby a first area of the first semiconductor region is defined by the device isolation layers; carrying out a first anisotropic etching process by use of a first resist mask for forming a first contact hole which penetrates the device isolation layer and reaches a top surface of the first semiconductor region, whereby a second area of the first semiconductor region is defined to be self-aligned to the first contact hole; removing the first resist mask; selectively forming at least a diffusion region of a second conductivity type in the first area and in an upper region of the first semiconductor region, so that the at least diffusion region has a bottom level shallower than a bottom level of the device isolation layers; forming an inter-layer insulator extending over the at least diffusion region and the device isolation region as well as in the first contact hole; carrying out a second anisotropic etching process by use of a second resist mask for forming at least a second contact hole which penetrates the inter-layer insulator and reaches a top surface of the at least diffusion region and also forming a third contact hole which penetrates the inter-layer insulator and reaches a top surface of the first semiconductor region; and carrying out an ion-implantation by use of the second resist mask for selectively introducing a second conductivity type impurity into an upper region of the at least diffusion region through the at least first contact hole and also into an upper region of the first semiconductor region through the second contact hole, whereby a first impurity doped region of the second conductivity type is selectively formed in the upper region of the first semiconductor region and is self-aligned to the second contact hole thereby forming a p-n junction diode having a p-n junction comprising an interface between the first semiconductor region and the first impurity doped region, whilst at least a second impurity doped region of the second conductivity type is also selectively formed in the upper region of the at least diffusion region and is self-aligned to the at least first contact hole, wherein a top level of the first impurity doped region corresponds to a bottom level of the device isolation layer and which is deeper than a bottom level of the at least diffusion region and shallower than a bottom level of the first impurity doped region, and a first distance defined between the bottom level of the first impurity doped region and a bottom level of the first semiconductor region is smaller than a second distance defined between the bottom level of the at least diffusion region and the bottom level of the first semiconductor region.

As described above, in accordance with the sixth present invention, the bottom level of the device isolation layer is deeper than the bottom level of the diffusion region. The third impurity doped region is positioned directly under the first contact hole or the third contact hole. The bottom level of the device isolation layer corresponds to the top level of the third impurity doped region. The bottom level of the third impurity doped region is thus deeper than the bottom level of the device isolation layer. Therefore, the bottom level of the third impurity doped region is thus deeper than the bottom level of the at least diffusion region. The bottom level of the first semiconductor layer is uniform over the first and second areas. Therefore, a first distance defined between the p-n junction of the p-n junction diode or the interface between the third impurity doped region and the bottom of the first semiconductor layer is smaller than a second distance defined between the bottom of the at least diffusion region and the bottom of the first semiconductor layer.

In accordance with the novel method of forming the semiconductor device, the first distance defined between the p-n junction of the p-n junction diode or the interface between the third impurity doped region and the bottom of the first semiconductor layer depends upon not only the thicknesses of the third impurity doped region and the first semiconductor layer but also the thickness or the depth of the device isolation layer 6. The third impurity doped region serves as an anode of the p-n junction diode. Namely, the depth of the p-n junction of the p-n junction diode or the bottom level of the third impurity doped region in the p-n junction diode region or the second area may be decided upon the depth of the bottom level of the device isolation layer or the thickness of the device isolation layer independently from the depth of the at least diffusion region in the semiconductor device region such as the metal oxide semiconductor field effect transistor region or the first area. The depth of the at least diffusion region and the depth of the first semiconductor layer are decided in consideration of the required dimensions and performances of the semiconductor device such as the semiconductor device such as the metal oxide semiconductor field effect transistor formed in the first area such as the metal oxide semiconductor field effect transistor region. However, the first distance "d" in the p-n junction diode region or the second area may be decided independently from the required dimensions and performances of the semiconductor device such as the metal oxide semiconductor field effect transistor formed in the first area such as the metal oxide semiconductor field effect transistor region. A breakdown voltage of the p-n junction diode formed between the third impurity doped region and the first semiconductor layer depends upon tile first distance "d" in the p-n junction diode region or the second area. Namely, the breakdown voltage of the p-n junction diode in the p-n junction diode region or the second area may be decided independent from the required dimensions and performances of the semiconductor device such as the metal oxide semiconductor field effect transistor formed in the first area such as the metal oxide semiconductor field effect transistor region. Since the first distance "d" in the p-n junction diode region or the second area is adjustable by controlling the thickness of the device isolation layer independently from the requirement for designing the semiconductor device such as the metal oxide semiconductor field effect transistor. Namely, the first distance "d" in the p-n junction diode region or the second area may be reduced for sufficiently reducing the breakdown voltage of the p-n junction diode in the p-n junction diode region or the second area independently from the requirement for designing the semiconductor device such as the metal oxide semiconductor field effect transistor. The reason why the p-n junction diode is formed in the p-n junction diode region or the second area is to cause a breakdown of the p-n junction diode so as to prevent the semiconductor device such as the metal oxide semiconductor field effect transistor from being broken due to the electrostatic discharge or the surge current and voltage. Since the breakdown voltage of the p-n junction diode formed in the p-n junction diode region or the second area is reduced, then this allows that the p-n junction diode shows a certain breakdown to prevent the semiconductor device such as the metal oxide semiconductor field effect transistor from being broken by the electrostatic discharge or the surge current and voltage applications.

PREFERRED EMBODIMENT

First Embodiment

A first embodiment according to the present invention will be described in detail with reference to the drawings. FIGS. 2A through 2E are fragmentary cross sectional elevation views illustrative of a novel semiconductor device provided with both a metal oxide semiconductor field effect transistor and an improved p-n junction diode in sequential steps involved in a novel fabrication method in accordance with the first embodiment according to the present invention. The semiconductor device has a metal oxide semiconductor field effect transistor region 21 and a p-n junction diode region 22.

Figure 2A:
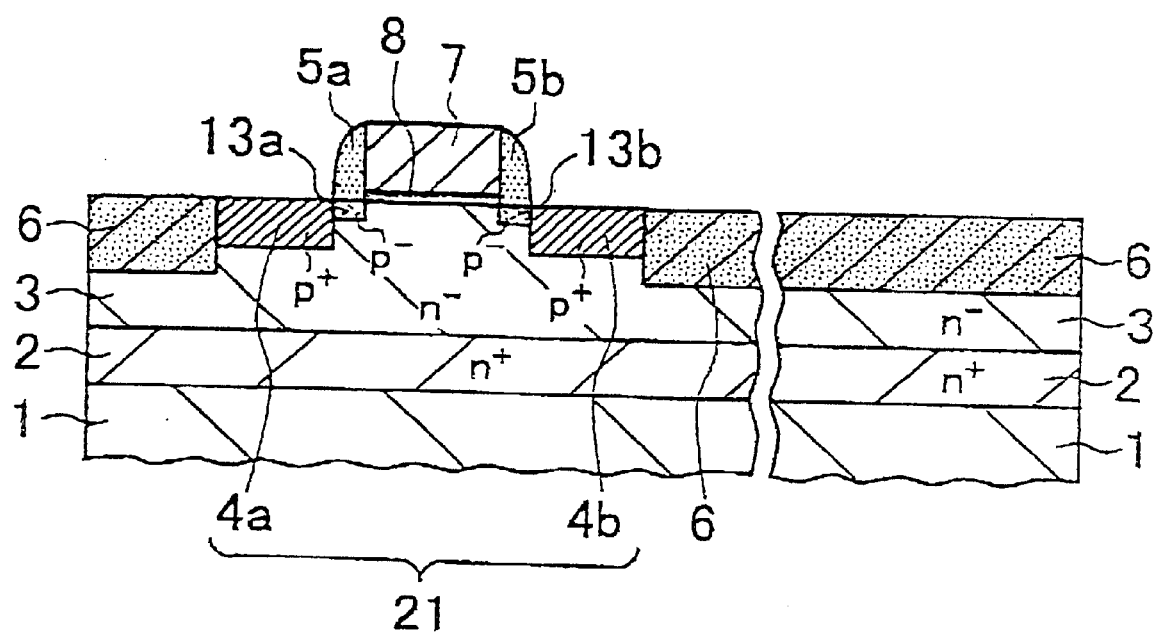
FIGS. 2A through 2E are fragmentary cross sectional elevation views illustrative of a novel semiconductor device provided with both a metal oxide semiconductor field effect transistor and an improved p-n junction diode in sequential steps involved in a novel fabrication method in accordance with the first embodiment according to the present invention.

With reference to FIG. 2A, an n+-type epitaxial layer 2 is formed on a top surface of a silicon substrate 1. An n⁻-type well region 3 is selectively formed in an upper region of the n+-type epitaxial layer 2. Device isolation layers 6 are selectively formed in upper regions of the n⁻-type well region 3, so that the device isolation layers 6 define only a metal oxide semiconductor field effect transistor region 21. The metal oxide semiconductor field effect transistor region 21 comprises a part of the n⁻-type well region 3 surrounded by the device isolation layers 6. The device isolation layers 6 may be made of silicon dioxide. The device isolation layers 6 may be formed by a local oxidation of silicon method or a trench isolation method or any other available method.

In the metal oxide semiconductor field effect transistor region 21, a gate insulation film 8 is selectively provided on the top surface of the n⁻-type well region 3. A gate electrode 7 is provided on the gate insulation film 8. A pair of p⁻-type lightly doped diffusion regions 13a and 13b are selectively formed in upper regions of the n⁻-type well region 3 by a self-alignment technique, wherein the p⁻-type lightly doped diffusion regions 13a and 13b are self-aligned to the gate electrode 7. Side wall insulation films 5a and 5b are formed on side walls of the gate electrode 7.

An ion-implantation process is then carried out by use of the gate electrode 7 and the side wall insulation films 5a and 5b as masks for selectively introducing a p-type impurity into only the metal oxide semiconductor field effect transistor region 21. As a result, in the metal oxide semiconductor field effect transistor region 21, source and drain p+-type diffusion regions 4a and 4b are selectively formed in the n⁻-type well region 3 so that the source and drain p+-type diffusion regions 4a and 4b are self-aligned to the gate electrode 7 and the side wall insulation films 5a and 5b, whereby lightly doped diffusion regions 13a and 13b remain only under the side wall insulation films 5a and 5b. The source and drain p+-type diffusion regions 4a and 4b are deeper than the lightly doped diffusion regions 13a and 13b. In the metal oxide semiconductor field effect transistor region 21, a source region comprises the p+-type diffusion region 4a and the lightly doped diffusion region 13a, whilst a drain region comprises the p+-type diffusion region 4b and the lightly doped diffusion region 13b.

Figure 2B:
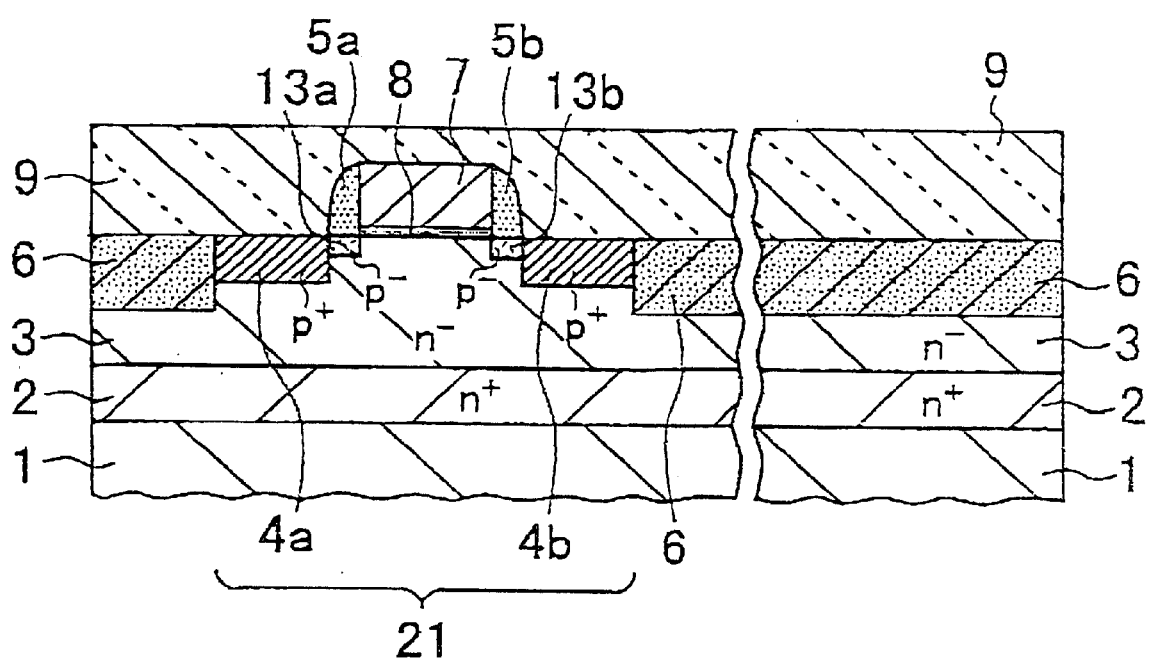

With reference to FIG. 2B, an inter-layer insulator 9 is further formed entirely which extends over the device isolation layers 6, the side wall insulation films 5a and 5b, the gate electrode 7 and the source and drain p+-type diffusion regions 4a and 4b. The inter-layer insulator 9 may comprise a boro-phospho silicate glass film.

Figure 2C:
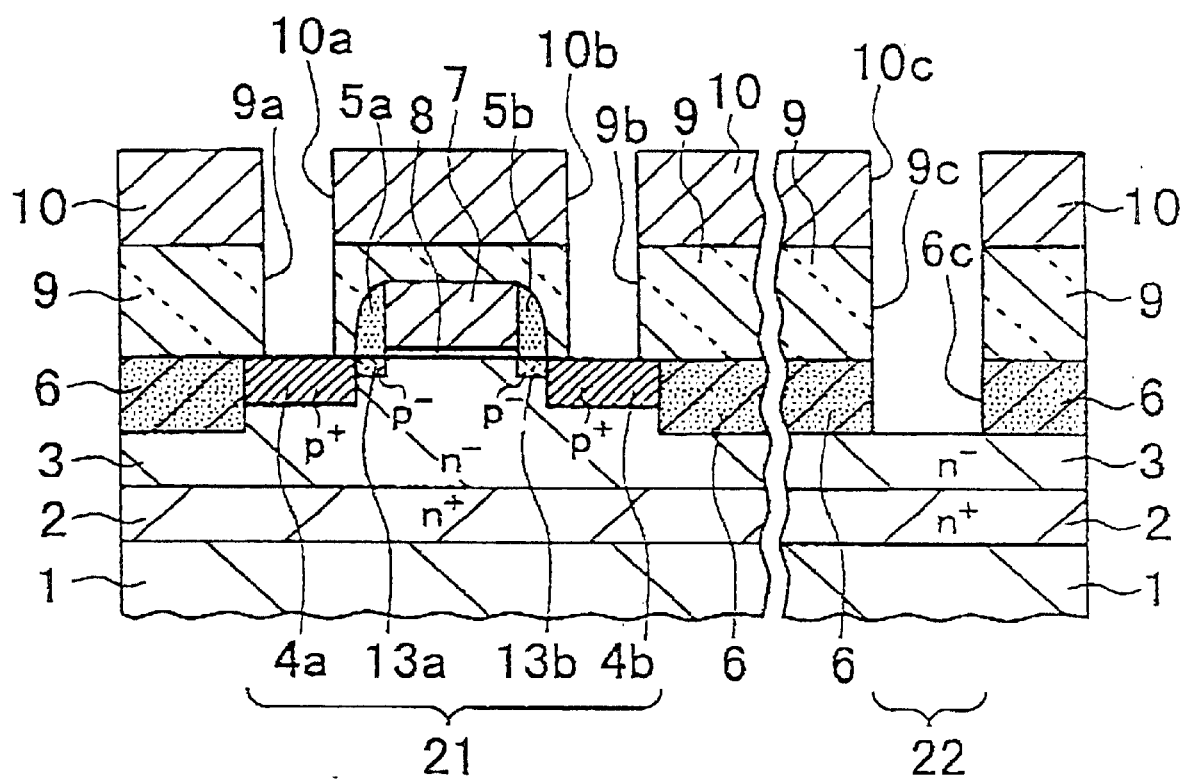

With reference to FIG. 2C, a resist film is entirely formed on the inter-layer insulator 9. A lithography is carried out to pattern the photo-resist film to form a resist mask 10 having first, second and third openings 10a, 10b and 10c on the inter-layer insulator 9. The resist mask 10 is used to carry out a selective anisotropic etching to the inter-layer insulator 9, whereby first, second and third contact holes 9a, 9b and 9c are formed in the inter-layer insulator 9 so that the first and second contact holes 9a and 9b reach the source and drain p+-type diffusion regions 4a and 4b, whilst the third contact hole 9c reaches the top surface of the device isolation layer 6, whereby parts of the source and drain p+-type diffusion regions 4a and 4b are shown through the first and second contact holes 9a and 9b whilst a part of the device isolation layer 6 is also shown through the third contact hole 9c. Further, the anisotropic etching is continued for selectively etching the device isolation layer 6 to form a fourth contact hole 6c in the device isolation layer 6, whereby the fourth contact hole 6c is positioned just under and self-aligned to the third contact hole 9c, so that the third and fourth contact holes 9c and 6c form a single contact hole which penetrates the inter-layer insulator 9 and the device isolation layer 6 and which reaches a top surface of the n⁻-type well region 3. As a result, a p-n junction diode region 22 is defined which is self-aligned to the third and fourth contact holes 9c and 6c. Namely, the p-n junction diode region 22 comprises a shown top surface of the n⁻-type well region 3, which is shown through and positioned under the third and fourth contact holes 9c and 6c. In this embodiment, the device isolation layer 6 and the inter-layer insulator 9 comprise $SiO_2$ based layers, for which reason the above anisotropic etching may be carried out by use of a reaction gas of $CHF_4$ or $CHF_3$. Any types of the above anisotropic etching, for example, a dry etching is available provided that a sufficient high selectivity and a sufficiently high anisotropy are obtained to form the first, second and third contact holes 9a, 9b and 9c in the inter-layer insulator 9 and the fourth contact hole 6c in the device isolation layer 6. The anisotropic etching by use of the resist mask 10 is discontinued just when the fourth contact hole 6c reaches the top surface of the n⁻-type well region 3 and the p-n junction diode 22 is de-fined.

In this embodiment, the first, second, third and fourth contact holes 9a, 9b, 9c and 6c are formed by the single anisotropic etching process. It is, of course, possible that the first, second and third contact holes 9a, 9b and 9c are formed in the inter-layer insulator 9 by the first anisotropic etching process, and then the fourth contact hole 6c is separately formed in the device isolation layer 6 by the second anisotropic etching process.

Figure 2D:
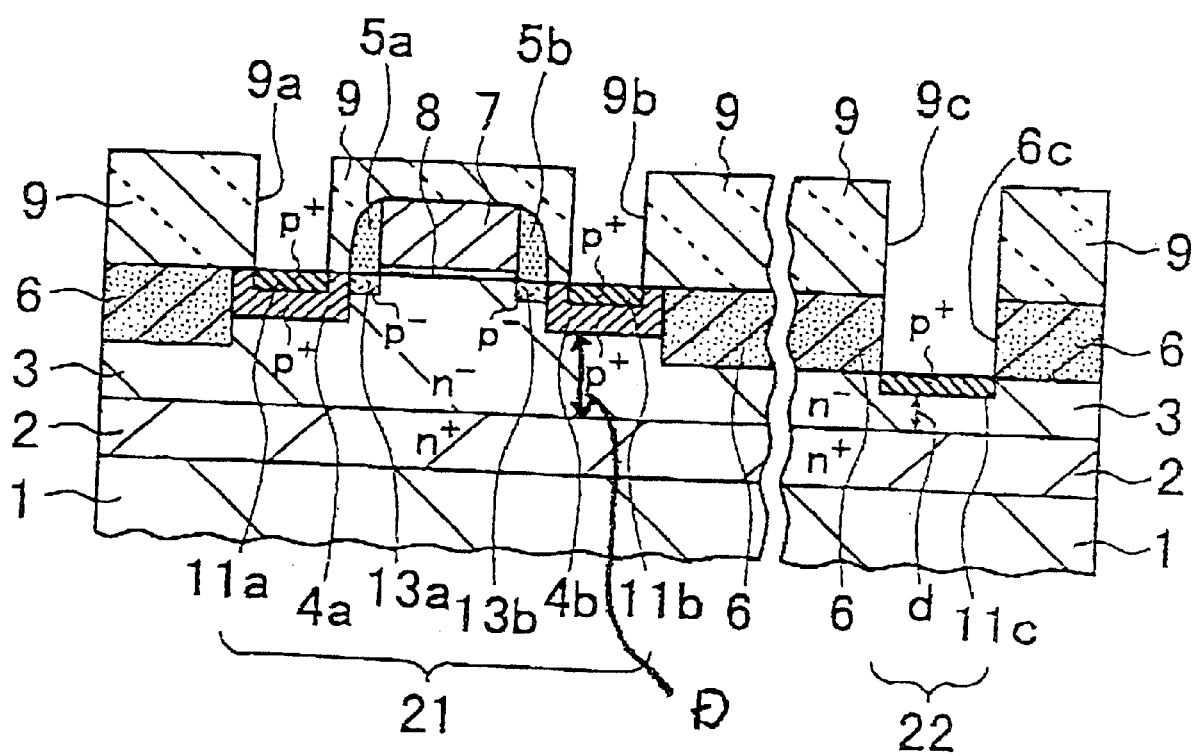

With reference to FIG. 2D, the used resist mask 10 is removed. The inter-layer insulator 9 having the contact holes 9a, 9b and 9c are used as a mask to carry out an ion-implantation of a p-type impurity, for example, boron for selectively introducing the p-type impurity into selected upper regions of the source and drain p+-type diffusion regions 4a and 4b, thereby to form first and second p+-type contact regions 11a and 11b in the selected upper regions of the source and drain p+-type diffusion regions 4a and 4b, wherein the first and second p+-type contact regions 11a and 11b are self-aligned to the first and second contact holes 9a and 9b This ion-implantation also introduces the p-type impurity into the p-n junction diode region 22 of the n⁻-type well region 3 to form a third p+-type contact region 11c on the p-n junction diode region 22 and in a selected upper region of the n⁻-type well region 3, wherein the third p+-type contact region 11c is self-aligned to the third contact hole 9c. The first, second and third p+-type contact regions 11a, 11b and 11c have the same thickness. The third p+-type contact region 11c has an interface with the n⁻-type well region 3. The p-n junction diode has a p-n junction which comprises the interface between the third p+-type contact region 11c and the n⁻-type well region 3.

As described above, the bottom level of the device isolation layer 6 is deeper than the bottom level of the source and drain p+-type diffusion regions 4a and 4b. The third p+-type contact region 11c is positioned directly under the fourth contact hole 6c. The bottom level of the device isolation layer 6 corresponds to the top level of the third p+-type contact region 11c. The bottom level of the third p+-type contact region 11c is thus deeper than the bottom level of the device isolation layer 6. Therefore, the bottom level of the third p+-type contact region 11c is thus deeper than the bottom level of the source and drain p+-type diffusion regions 4a and 4b. The bottom level of the n⁻-type well region 3 is uniform over the p-n junction diode region 22 and the metal oxide semiconductor field effect transistor region 21. Therefore, a first distance "d" defined between the p-n junction of the p-n junction diode or the interface between the third p+-type contact region 11c and the bottom of the n⁻-type well region 3 is smaller than a second distance "D" defined between the bottom of the source and drain p+-type diffusion regions 4a and 4b and the bottom of the n⁻-type well region 3.

In accordance with the novel method of forming the semiconductor device, the first distance "d" defined between the p-n junction of the p-n junction diode or the interface between the third p+-type contact region 11c and the bottom of the n⁻-type well region 3 depends upon not only the thicknesses of the third p+-type contact region 11c and the n+-type well region 3 but also the thickness or the depth of the device isolation layer 6. The third p+-type contact region 11c serves as an anode of the p-n junction diode. Namely, the depth of the p-n junction of the p-n junction diode or the bottom level of the third p+-type contact region 11c in the p-n junction diode region 22 may be decided upon the depth of the bottom level of the device isolation layer 6 or the thickness of the device isolation layer 6 independently from the depth of the source and drain p+-type diffusion regions 4a and 4b in the metal oxide semiconductor field effect transistor region 21. The depth of the source and drain p+-type diffusion regions 4a and 4b and the depth of the n⁻-type well region 3 are decided in consideration of the required dimensions and performances of the metal oxide semiconductor field effect transistor formed in the metal oxide semiconductor field effect transistor region 21. However, the first distance "d" in the p-n junction diode region, 22 may be decided independently from the required dimensions and performances of the metal oxide semiconductor field effect transistor formed in the metal oxide semiconductor field effect transistor region 21. A breakdown voltage of the p-n junction diode formed between the p+-type region 11c and the n--type well region 3 depends upon the first distance "d" in the p-n junction diode region 22. Namely, the breakdown voltage of the p-n junction diode in the p-n junction diode region 22 may be decided independent from the required dimensions and performances of the metal oxide semiconductor field effect transistor formed in the metal oxide semiconductor field effect transistor region 21. Since the first distance "d" in the p-n junction diode region 22 is adjustable by controlling the thickness of the device isolation layer 6 independently from the requirement for designing the metal oxide semiconductor field effect transistor. Namely, the first distance "d" in the p-n junction diode region 22 may be reduced for sufficiently reducing the breakdown voltage of the p-n junction diode in the p-n junction diode region 22 independently from the requirement for designing the metal oxide semiconductor field effect transistor. The reason why the p-n junction diode is formed in the p-n junction diode region 22 is to cause a breakdown of the p-n junction diode so as to prevent the metal oxide semiconductor field effect transistor from being broken due to the electrostatic discharge or the surge current and voltage. Since the breakdown voltage of the p-n junction diode formed in the p-n junction diode region 22 is reduced, then this allows that the p-n junction diode shows a certain breakdown to prevent the metal oxide semiconductor field effect transistor from being broken by the electrostatic discharge or the surge current and voltage applications.

Figure 2E:
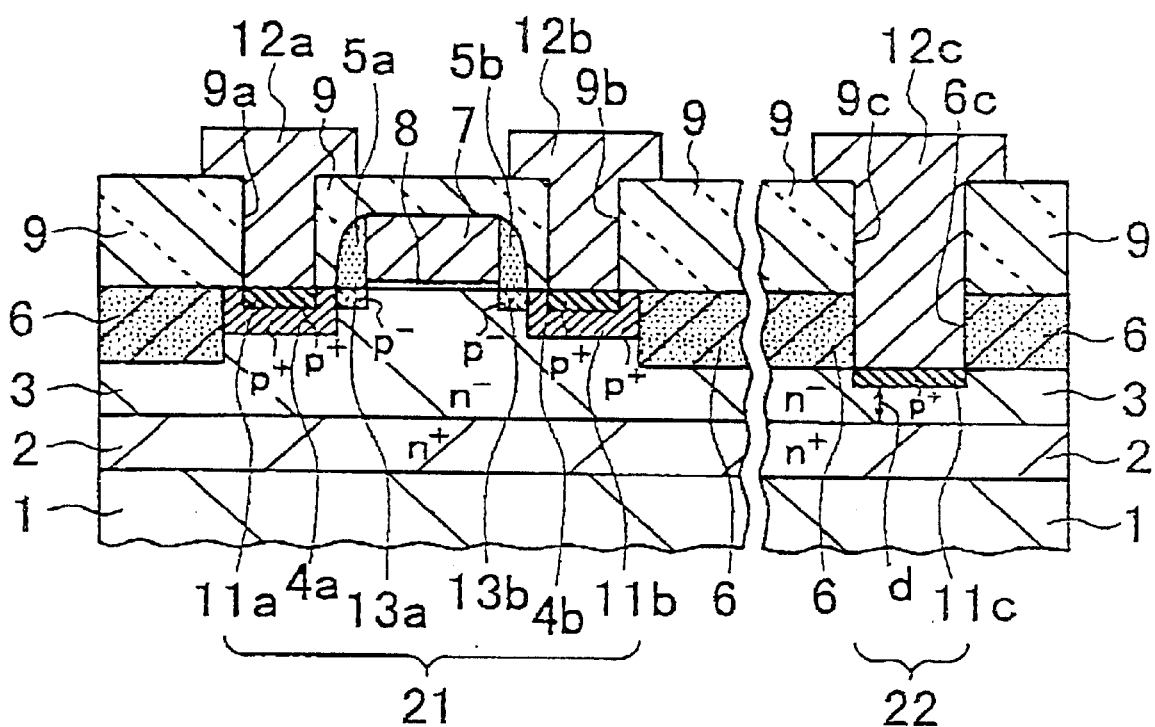

With reference to FIG. 2E, first, second and third electrodes 12a, 12b and 12c are selectively formed by the known technique in the first, second, third and fourth contact holes 9a, 9b, 9c and 6c and on the inter-layer insulator 9 The first electrode 12a is formed in the first contact hole 9a so that the bottom of the first electrode 12a is in contact with the first p+-type contact region 11a. The second electrode 12b is formed in the second contact hole 9b so that the bottom of the second electrode 12b is in contact with the second p+-type contact region 11b. The third electrode 12c is formed in the third and fourth contact holes 9c and 6c so that the bottom of the third electrode 12c is in contact with the third p+-type contact region 11c.

Even illustration is omitted, a further inter-layer insulator and an interconnection as well as a passivation layer may be formed, whereby the fabrication of the semiconductor device is completed.

As described above, the bottom level of the device isolation layer 6 is deeper than the bottom level of the source and drain p+-type diffusion regions 4a and 4b. The third p+-type contact region 11c is positioned directly under the fourth contact hole 6c. The bottom level of the device isolation layer 6 corresponds to the top level of the third p+-type contact region 11c. The bottom level of the third p+-type contact region 11c is thus deeper than the bottom level of the device isolation layer 6. Therefore, the bottom level of the third p+-type contact region 11c is thus deeper than the bottom level of the source and drain p+-type diffusion regions 4a and 4b. The bottom level of the n⁻-type well region 3 is uniform over the p-n junction diode region 22 and the metal oxide semiconductor field effect transistor region 21. Therefore, a first distance "d" defined between the p-n junction of the p-n junction diode or the interface between the third p+-type contact region 11c and the bottom of the n⁻-type well region 3 is smaller than a second distance "D" defined between the bottom of the source and drain p+-type diffusion regions 4a and 4b and the bottom of the n⁻-type well region 3.

In accordance with the novel method of forming the semiconductor device, the first distance "d" defined between the p-n junction of the p-n junction diode or the interface between the third p+-type contact region 11c and the bottom of the n⁻-type well region 3 depends upon not only the thicknesses of the third p+-type contact region 11c and the n+-type well region 3 but also the thickness or the depth of the device isolation layer 6. The third p+-type contact region 11c serves as an anode of the p-n junction diode. Namely, the depth of the p-n junction of the p-n junction diode or the bottom level of the third p+-type contact region 11c in the p-n junction diode region 22 may be decided upon the depth of the bottom level of the device isolation layer 6 or the thickness of the device isolation layer 6 independently from the depth of the source and drain p+-type diffusion regions 4a and 4b in the metal oxide semiconductor field effect transistor region 21. The depth of the source and drain p+-type diffusion regions 4a and 4b and the depth of the n⁻-type well region 3 are decided in consideration of the required dimensions and performances of the metal oxide semiconductor field effect transistor formed in the metal oxide semiconductor field effect transistor region 21. However, the first distance "d" in the p-n junction diode region 22 may be decided independently from the required dimensions and performances of the metal oxide semiconductor field effect transistor formed in the metal oxide semiconductor field effect transistor region 21. A breakdown voltage of the p-n junction diode formed between the p+-type region 11c and the n--type well region 3 depends upon the first distance "d" in the p-n junction diode region 22. Namely, the breakdown voltage of the p-n junction diode in the p-n junction diode region 22 may be decided independent from the required dimensions and performances of the metal oxide semiconductor field effect transistor formed in the metal oxide semiconductor field effect transistor region 21. Since the first distance "d" in the p-n junction diode region 22 is adjustable by controlling the thickness of the device isolation layer 6 independently from the requirement for designing the metal oxide semiconductor field effect transistor. Namely, the first distance "d" inthe p-n junction diode region 22 may be reduced for sufficiently reducing the breakdown voltage of the p-n junction diode in the p-n junction diode region 22 independently from the requirement for designing the metal oxide semiconductor field effect transistor. The reason why the p-n junction diode is formed in the p-n junction diode region 22 is to cause a breakdown of the p-n junction diode so as to prevent the metal oxide semiconductor field effect transistor from being broken due to the electrostatic discharge or the surge current and voltage. Since the breakdown voltage of the p-n junction diode formed in the p-n junction diode region 22 is reduced, then this allows that the p-n junction diode shows a certain breakdown to prevent the metal oxide semiconductor field effect transistor from being broken by the electrostatic discharge or the surge current and voltage applications.

The fourth contact hole 6c in the device isolation layer 6 is formed by the anisotropic etching using the resist mask 10 which is also carried out for forming the first, second and third contact holes 9a, 9b and 9c in the inter-layer insulator 9. The third p+-type contact region 11c is formed by the ion-implantation which is also carried out for forming the first and second p+-type contact regions 11a and 11b. Namely, the p-n junction diode may be formed without increasing the number of the fabrication steps.

As in the embodiment, the p-channel metal oxide semiconductor field effect transistor is formed in the n-well region. It is, of course, possible that the n-channel metal oxide semiconductor field effect transistor is formed in the p-well region.

As in the embodiment, the source and drain diffusion regions have lightly doped drain structures. It is, of course, possible that the source and drain diffusion regions are free of lightly doped drain structures or may have any other structures.

The p-n junction diode and the source and drain diffusion regions of the metal oxide semiconductor field effect transistor are formed in the well region over the epitaxial layer over the silicon substrate. It is, of course, possible that the p-n junction diode and the source and drain diffusion regions of the metal oxide semiconductor field effect transistor are formed in upper regions of the silicon substrate without forming the well region and the epitaxial layer. It is also possible to change the epitaxial layer into a pseudo epitaxial layer which is formed by an ion-implantation into an upper region of the silicon substrate.

As in the above embodiment, the p-n junction diode is provided for protecting the metal oxide semiconductor field effect transistor from being broken due to the electrostatic discharge or the surge current and voltage. It is, however, possible that in place of the metal oxide semiconductor field affect transistor, any other semiconductor device having at least a diffusion region is formed and the p-n junction diode protects the other semiconductor device from being broken due to the electrostatic discharge or the surge current and voltage. Namely, the present invention may be applicable to the other semiconductor device having at least a diffusion region than the metal oxide semiconductor field effect transistor.

Second Embodiment

A second embodiment according to the present invention will be described in detail with reference to the drawings. FIGS. 3A through 3F are fragmentary cross sectional elevation views illustrative of a novel semiconductor device provided with both a metal oxide semiconductor field effect transistor and an improved p-n junction diode in sequential steps involved in a novel fabrication method in accordance with the second embodiment according to the present invention. The semiconductor device has a metal oxide semiconductor field effect transistor region 21 and a p-n junction diode region 22.

Figure 3A:
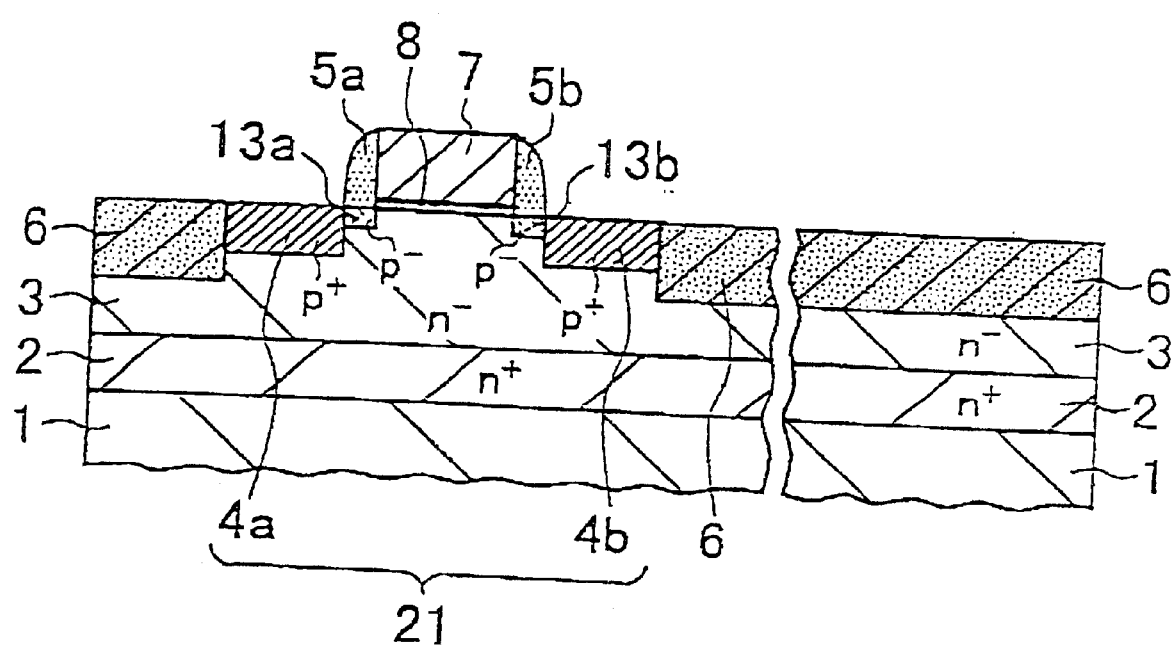
FIGS. 3A through 3F are fragmentary cross sectional elevation views illustrative of a novel semiconductor device provided with both a metal oxide semiconductor field effect transistor and an improved p-n junction diode in sequential steps involved in a novel fabrication method in accordance with the second embodiment according to the present invention.

With reference to FIG. 3A, an n+-type epitaxial layer 2 is formed on a top surface of a silicon substrate 1. An n⁻-type well region 3 is selectively formed in an upper region of the n+-type epitaxial layer 2. Device isolation layers 6 are selectively formed in upper regions of the n⁻-type well region 3, so that the device isolation layers 6 define only a metal oxide semiconductor field effect transistor region 21. The metal oxide semiconductor field effect transistor region 21 comprises a part of the n⁻- type well region 3 surrounded by the device isolation layers 6. The device isolation layers 6 may be made of silicon dioxide. The device isolation layers 6 may be formed by a local oxidation of silicon method or a trench isolation method or any other available method.

In the metal oxide semiconductor field effect transistor region 21, a gate insulation film 8 is selectively provided on the top surface of the n⁻-type well region 3. A gate electrode 7 is provided on the gate insulation film 8. A pair of p⁻-type lightly doped diffusion regions 13a and 13b are selectively formed in upper regions of the n⁻-type well region 3 by a self-alignment technique, wherein the p⁻-type lightly doped diffusion regions 13a and 13b are self-aligned to the gate electrode 7. Side wall insulation films 5a and 5b are formed on side walls of the gate electrode 107.

An ion-implantation process is then carried out by use of the gate electrode 7 and the side wall insulation films 5a and 5b as masks for selectively introducing a p-type impurity into only the metal oxide semiconductor field effect transistor region 21. As a result, in the metal oxide semiconductor field effect transistor region 21, source and drain p+-type diffusion regions 4a and 4b are selectively formed in the n⁻-type well region 3 so that the source and drain p+-type diffusion regions 4a and 4b are self-aligned to the gate electrode 7 and the side wall insulation films 5a and 5b, whereby lightly doped diffusion regions 13a and 13b remain only under the side wall insulation films 5a and 5b. The source and drain p+-type diffusion regions 4a and 4b are deeper than the lightly doped diffusion regions 13a and 13b. In the metal oxide semiconductor field effect transistor region 21, a source region comprises the p+-type diffusion region 4a and the lightly doped diffusion region 13a, whilst a drain region comprises the p+-type diffusion region 4b and the lightly doped diffusion region 13b.

Figure 3B:
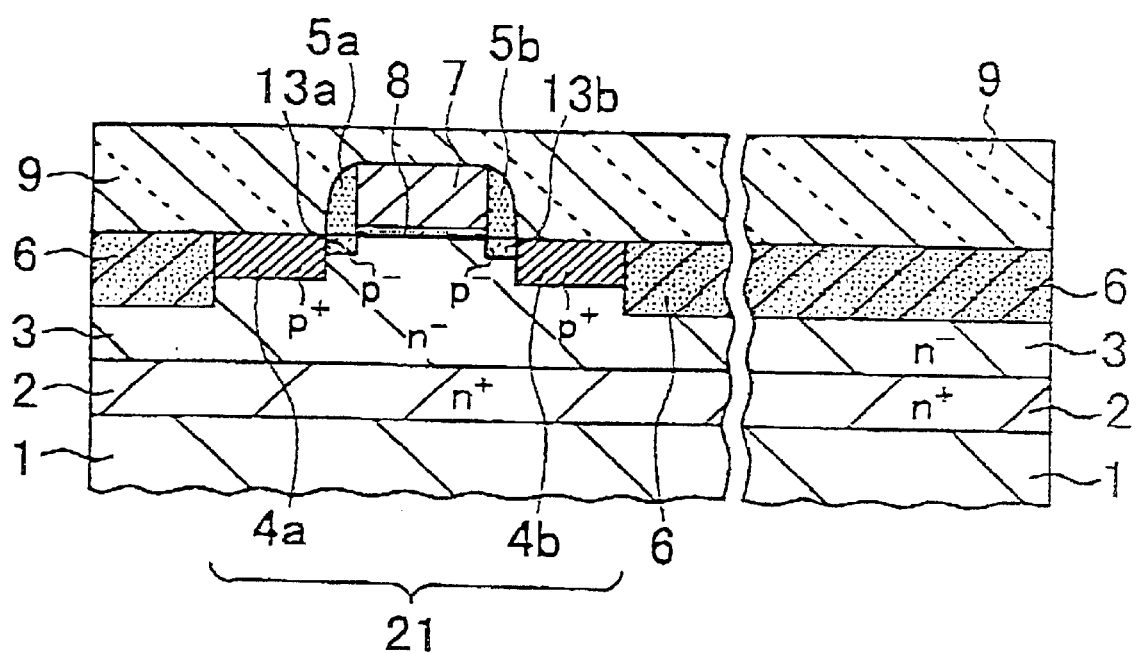

With reference to FIG. 3B, an inter-layer insulator 9 is further formed entirely which extends over the device isolation layers 6, the side wall insulation films 5a and 5b, the gate electrode 7 and the source and drain p+-type diffusion regions 4a and 4b. The inter-layer insulator 9 may comprise a boro-phospho silicate glass film.

Figure 3C:
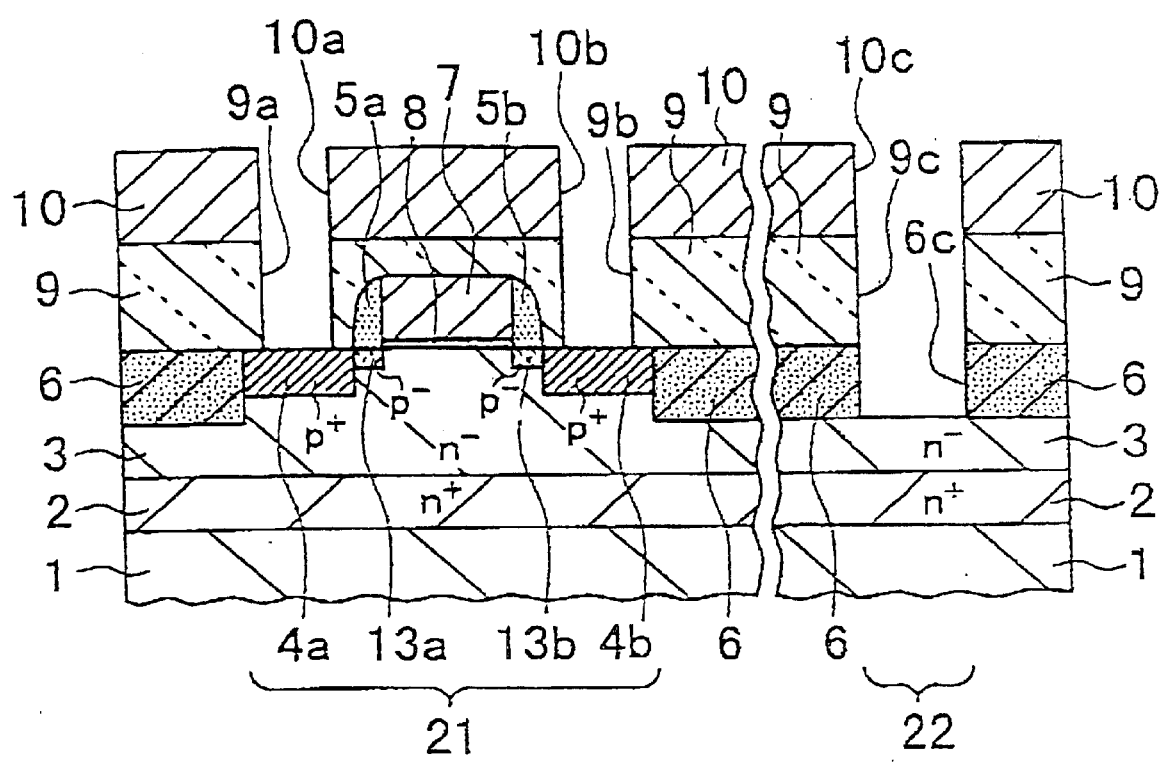

With reference to FIG. 3C, a resist film is entirely formed on the inter-layer insulator 9. A lithography is carried out to pattern the photoresist film to form a resist mask 10 having first, second and third openings 10a, 10b and 10c on the inter-layer insulator 9. The resist mask 10 is used to carry out a selective anisotropic etching to the inter-layer insulator 9, whereby first, second and third contact holes 9a, 9b and 9c are formed in the inter-layer insulator 9 so that the first and second contact holes 9a and 9b reach the source and drain p+-type diffusion regions 4a and 4b, whilst the third contact hole 9c reaches the top surface of the device isolation layer 6, whereby parts of the source and drain p+-type diffusion regions 4a and 4b are shown through the first and second contact holes 9a and 9b whilst a part of the device isolation layer 6 is also shown through the third contact hole 9c. Further, the anisotropic etching is continued for selectively etching the device isolation layer 6 to form a fourth contact hole 6c in the device isolation layer 6, whereby the fourth contact hole 6c is positioned just under and self-aligned to the third contact hole 9c, so that the third and fourth contact holes 9c and 6c form a single contact hole which penetrates the inter-layer insulator 9 and the device isolation layer 6 and which reaches a top surface of the n⁻-type well region 3. As a result, a p-n junction diode region 22 is defined which is self-aligned to the third and fourth contact holes 9c and 6c. Namely, the p-n junction diode region 22 comprises a shown top surface of the n⁻-type well region 3, which is shown through and positioned under the third and fourth contact holes 9c and 6c. In this embodiment, the device isolation layer 6 and the inter-layer insulator 9 comprise $SiO_2$ based layers, for which reason the above anisotropic etching may be carried out by use of a reaction gas of $CHF_4$ or $CHF_3$. Any types of the above anisotropic etching, for example, a dry etching is available provided that a sufficient high selectivity and a sufficiently high anisotropy are obtained to form the first, second and third contact holes 9a, 9b and 9c in the inter-layer insulator 9 and the fourth contact hole 6c in the device isolation layer 6. The anisolropic etching by use of the resist mask 10 is discontinued just when the fourth contact hole 6c reaches the top surface of the n⁻-type well region 3 and the p-n junction diode 22 is defined.

In this embodiment, the first, second, third and fourth contact holes 9a, 9b, 9c and 6c are formed by the single anisotropic etching process. It is, of course, possible that the first, second and third contact holes 9a, 9b and 9c are formed in the inter-layer insulator 9 by the first anisotropic etching process, and then the fourth contact hole 6c is separately formed in the device isolation layer 6 by the second anisotropic etching process.

Figure 3D:
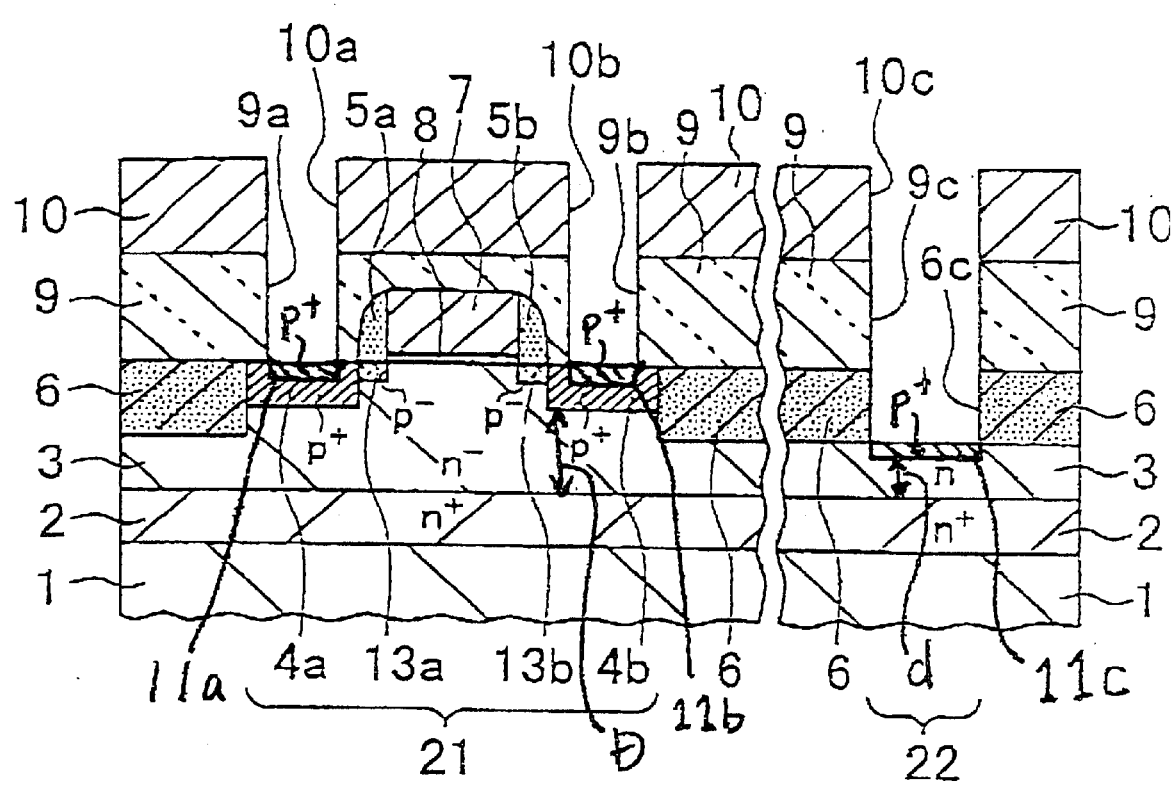

With reference to FIG. 3D, the resist mask 10 is still used to carry out an ion-implantation of a p-type impurity, for example, boron for selectively introducing the p-type impurity into selected upper regions of the source and drain p+-type diffusion regions 4a and 4b, thereby to form first and second p+-type contact regions 11a and 11b in the selected upper regions of the source and drain p+-type diffusion regions 4a and 4b, wherein the first and second p+-type contact regions 11a and 11b are self-aligned to the first and second contact holes 9a and 9b. This ion-implantation also introduces the p-type impurity into the p-n junction diode region 22 of the n⁻-type well region 3 to form a third p+-type contact region 11c on the p-n junction diode region 22 and in a selected upper region of the n⁻-type well region 3, wherein the third p+-type contact region 11c is self-aligned to the third contact hole 9c. The first, second and third p+-type contact regions 11a, 11b and 11c have the same thickness. The third p+-type contact region 11c has an interface with the n⁻-type well region 3. The p-n junction diode has a p-n junction which comprises the interface between the third p+-type contact region 11c and the n⁻-type well region 3.

As described above, the bottom level of the device isolation layer 6 is deeper than the bottom level of the source and drain p+-type diffusion regions 4a and 4b. The third p+-type contact region 11c is positioned directly under the fourth contact hole 6c. The bottom level of the device isolation layer 6 corresponds to the top level of the third p+-type contact region 11c. The bottom level of the third p+-type contact region 11c is thus deeper than the bottom level of the device isolation layer 6. Therefore, the bottom level of the third p+-type contact region 11c is thus deeper than the bottom level of the source and drain p+-type diffusion regions 4a and 4b. The bottom level of the n⁻-type well region 3 is uniform over the p-n junction diode region 22 and the metal oxide semiconductor field effect transistor region 21. Therefore, a first distance "d" defined between the p-n junction of the p-n junction diode or the interface between, the third p+-type contact region 11c and the bottom of the n⁻-type well region 3 is smaller than a second distance "D" defined between the bottom of the source and drain p+-type diffusion regions 4a and 4b and the bottom of the n⁻-type well region 3.

In accordance with the novel method of forming the semiconductor device, the first distance "d" defined between the p-n junction of the p-n junction diode or the interface between the third p+-type contact region 11c and the bottom of the n⁻-type well region 3 depends upon not only the thicknesses of the third p+-type contact region 11c and the n+-type well region 3 but also the thickness or the depth of the device isolation layer 6. The third p+-type contact region 11c serves as an anode of the p-n junction diode. Namely, the depth of the p-n junction of the p-n junction diode or the bottom level of the third p+-type contact region 11c in the p-n junction diode region 22 may be decided upon the depth of the bottom level of the device isolation layer 6 or the thickness of the device isolation layer 6 independently from the depth of the source and drain p+-type diffusion regions 4a and 4b in the metal oxide semiconductor field effect transistor region 21. The depth of the source and drain p+-type diffusion regions 4a and 4b and the depth of the n⁻-type well region 3 are decided in consideration of the required dimensions and performances of the metal oxide semiconductor field effect transistor formed in the metal oxide semiconductor field effect transistor region 21. However, the first distance "d" in the p-n junction diode region 22 may be decided independently from the required dimensions and performances of the metal oxide semiconductor field effect transistor formed in the metal oxide semiconductor field effect transistor region 21. A breakdown voltage of the p-n junction diode formed between the p+-type region 11c and the n⁻-type well region 3 depends upon the first distance "d" in the p-n junction diode region 22. Namely, the breakdown voltage of the p-n junction diode in the p-n junction diode region 22 may be decided independent from the required dimensions and performances of the metal oxide semiconductor field effect transistor formed in the metal oxide semiconductor field effect transistor region 21. Since the first distance "d" in the p-n junction diode region 22 is adjustable by controlling the thickness of the device isolation layer 6 independently from the requirement for designing the metal oxide semiconductor field effect transistor. Namely, the first distance "d" in the p-n junction diode region 22 may be reduced for sufficiently reducing the breakdown voltage of the p-n junction diode in the p-n junction diode region 22 independently from the requirement for designing the metal oxide semiconductor field effect transistor. The reason why the p-n junction diode is formed in the p-n junction diode region 22 is to cause a breakdown of the p-n junction diode so as to prevent the metal oxide semiconductor field effect transistor from being broken due to the electrostatic discharge or the surge current and voltage. Since the breakdown voltage of the p-n junction diode formed in the p-n junction diode region 22 is reduced, then this allows that the p-n junction diode shows a certain breakdown to prevent the metal oxide semiconductor field effect transistor from being broken by the electrostatic discharge or the surge current and voltage applications.

Figure 3E:
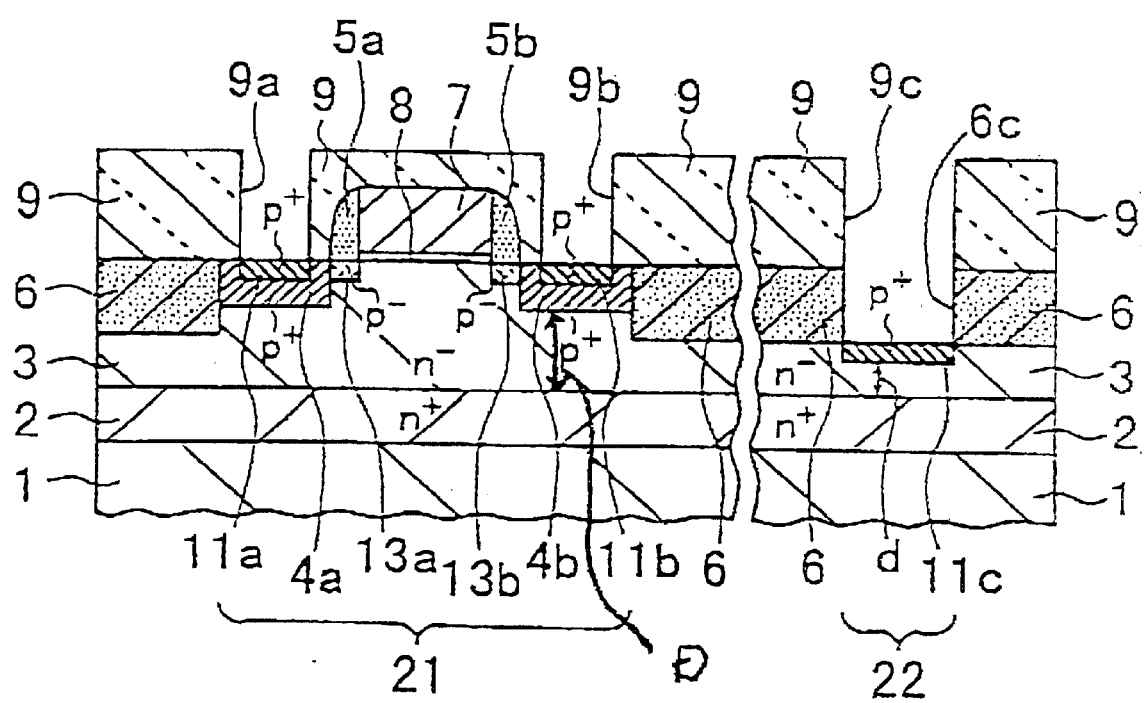

With reference to FIG. 3E, the used resist mask 10 is removed.

Figure 3F:
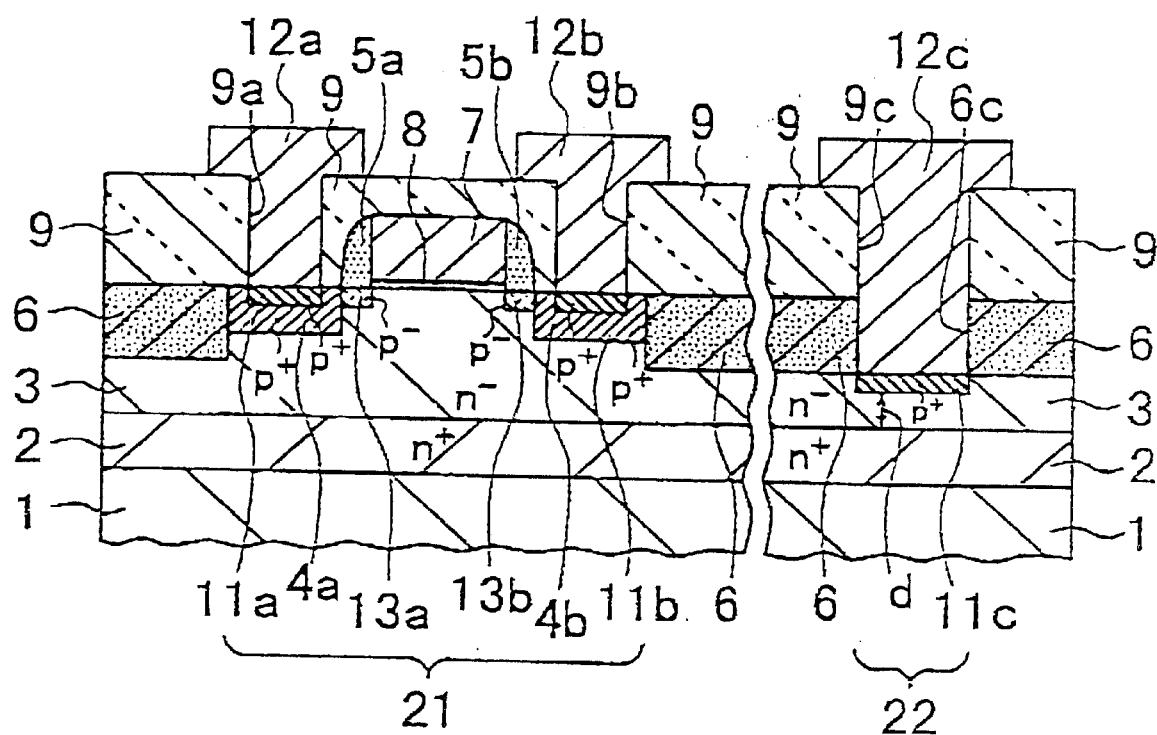

With reference to FIG. 3F, first, second and third electrodes 12a, 12b and 12c are selectively formed by the known technique in the first, second, third and fourth contact holes 9a, 9b, 9c and 6c and on the inter-layer insulator 9. The first electrode 12a is formed in the first contact hole 9a so that the bottom of the first electrode 12a is in contact with the first p+-type contact region 11a. The second electrode 12b is formed in the second contact hole 9b so that the bottom of the second electrode 12b is in contact with the second p+-type contact region 11b. The third electrode 12c is formed in the third and fourth contact holes 9c and 6c so that the bottom of the third electrode 12c is in contact with the third p+-type contact region 11c.

Even illustration is omitted, a further inter-layer insulator and an interconnection as well as a passivation layer may be formed, whereby the fabrication of the semiconductor device is completed.

As described above, the bottom level of the device isolation layer 6 is deeper than the bottom level of the source and drain p+-type diffusion regions 4a and 4b. The third p+-type contact region 11c is positioned directly under the fourth contact hole 6c. The bottom level of the device isolation layer 6 corresponds to the top level of the third p+-type contact region 11c. The bottom level of the third p+-type contact region 11c is thus, deeper than the bottom level of the device isolation layer 6. Therefore, the bottom level of the third p+-type contact region 11c is thus deeper than the bottom level of the source and drain p+-type diffusion regions 4a and 4b. The bottom level of the n⁻-type well region 3 is uniform over the p-n junction diode region 22 and the metal oxide semiconductor field effect transistor region 21. Therefore, a first distance "d" defined between the p-n junction of the p-n junction diode or the interface between the third p+-type contact region 11c and the bottom of the n⁻-type well region 3 is smaller than a second distance "D" defined between the bottom of the source and drain p+-type diffusion regions 4a and 4b and the bottom of the n⁻-type well region 3.

In accordance with the novel method of forming the semiconductor device, the first distance "d" defined between the p-n junction of the p-n junction diode or the interface between the third p+-type contact region 11c and the bottom of the n⁻-type well region 3 depends upon not only the thicknesses of the third p+-type contact region 11c and the n+-type well region 3 but also the thickness or the depth of the device isolation layer 6. The third p+-type contact region 11c serves as an anode of the p-n junction diode. Namely, the depth of the p-n junction of the p-n junction diode or the bottom level of the third p+-type contact region 11c in the p-n junction diode region 22 may be decided upon the depth of the bottom level of the device isolation layer 6 or the thickness of the device isolation layer 6 independently from the depth of the source and drain p+-type diffusion regions 4a and 4b in the metal oxide semiconductor field effect transistor region 21. The depth of the source and drain p+-type diffusion regions 4a and 4b and the depth of the n⁻-type well region 3 are decided in consideration of the required dimensions and performances of the metal oxide semiconductor field effect transistor formed in the metal oxide semiconductor field effect transistor region 21. However, the first distance "d" in the p-n junction diode region 22 may be decided independently from the required dimensions and performances of the metal oxide semiconductor field effect transistor formed in the metal oxide semiconductor field effect transistor region 21. A breakdown voltage of the p-n junction diode formed between the p+-type region 11c and the n⁻-type well region 3 depends upon the first distance "d" in the p-n junction diode region 22. Namely, the breakdown voltage of the p-n junction diode in the p-n junction diode region 22 may be decided independent from the required dimensions and perfomances of the metal oxide semiconductor field effect transistor formed in the metal oxide semiconductor field effect transistor region 21. Since the first distance "d" in the p-n junction diode region 22 is adjustable by controlling the thickness of the device isolation layer 6 independently from the requirement for designing the metal oxide semiconductor field effect transistor. Namely, the first distance "d" in the p-n junction diode region 22 may be reduced for sufficiently reducing the breakdown voltage of the p-n junction diode in the p-n junction diode region 22 independently from the requirement for designing the metal oxide semiconductor field effect transistor. The reason why the p-n junction diode is formed in the p-n junction diode region 22 is to cause a breakdown of the p-n junction diode so as to prevent the metal oxide semiconductor field effect transistor from being broken due to the electrostatic discharge or the surge current and voltage. Since the breakdown voltage of the p-n junction diode formed in the p-n junction diode region 22 is reduced, then this allows that the p-n junction diode shows a certain breakdown to prevent the metal oxide semiconductor field effect transistor from being broken by the electrostatic discharge or the surge current and voltage applications.

The fourth contact hole 6c in the device isolation layer 6 is formed by the anisotropic etching using the resist mask 10 which is also carried out for forming the first, second and third contact holes 9a, 9b and 9c in the inter-layer insulator 9. The third p+-type contact region 11c is formed by the ion-implantation which is also carried out using the resist mask 10 for forming the first and second p+-type contact regions 11a and 11b. Namely, the p-n junction diode may be formed without increasing the number of the fabrication steps.

As in the embodiment. the p-channel metal oxide semiconductor field effect transistor is formed in the n-well region. It is, of course, possible that the n-channel metal oxide semiconductor field effect transistor is formed in the p-well region.

As in the embodiment, the source and drain diffusion regions have lightly doped drain structures. It is, of course, possible that the source and drain diffusion regions are free of lightly doped drain structures or may have any other structures.

The p-n junction diode and the source and drain diffusion regions of the metal oxide semiconductor field effect transistor are formed in the well region over the epitaxial layer over the silicon substrate. It is, of course, possible that the p-n junction diode and the source and drain diffusion regions of the metal oxide semiconductor field effect transistor are formed in upper regions of the silicon substrate without forming the well region and the epitaxial layer. It is also possible to change the epitaxial layer into a pseudo epitaxial layer which is formed by an ion-implantation into an upper region of the silicon substrate.

As in the above embodiment, the p-n junction diode is provided for protecting the metal oxide semiconductor field effect transistor from being broken due to the electrostatic discharge or the surge current and voltage. It is, however, possible that in place of the metal oxide semiconductor field effect transistor, any other semiconductor device having at least a diffusion region is formed and the p-n junction diode protects the other semiconductor device from being broken due to the electrostatic discharge or the surge current and voltage. Namely, the present invention may be applicable to the other semiconductor device having at least a diffusion region than the metal oxide semiconductor field effect transistor.

Third Embodiment

A third embodiment according to the present invention will be described in detail with reference to the drawings. FIGS. 4A through 4G are fragmentary cross sectional elevation views illustrative of a novel semiconductor device provided with both a metal oxide semiconductor field effect transistor and an improved p-n junction diode in sequential steps involved in a novel fabrication method in accordance with the third embodiment according to the present invention. The semiconductor device has a metal oxide semiconductor field effect transistor region 21 and a p-n junction diode region 22.

Figure 4A:
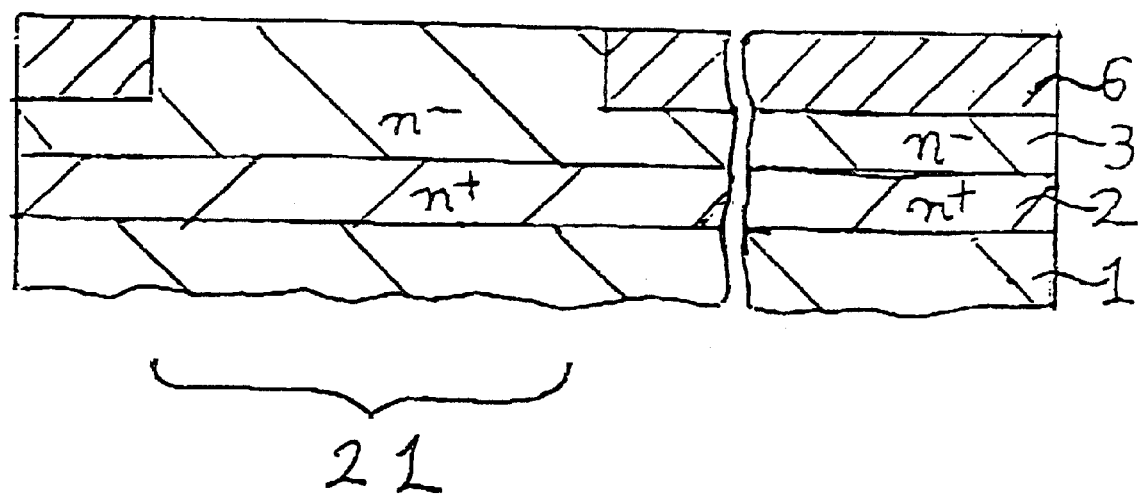
FIGS. 4A through 4G are fragmentary cross sectional elevation views illustrative of a novel semiconductor device provided with both a metal oxide semiconductor field effect transistor and an improved p-n junction diode in sequential steps involved in a novel fabrication method in accordance with the third embodiment according to the present invention.

With reference to FIG. 4A, an n+-type epitaxial layer 2 is formed on a top surface of a silicon substrate 1. An n⁻-type well region 3 is selectively formed in an upper region of the n+-type epitaxial layer 2. Device isolation layers 6 are selectively formed in upper regions of the n⁻-type well region 3, so that the device isolation layers 6 define only a metal oxide semiconductor field effect transistor region 21. The metal oxide semiconductor field effect transistor region 21 comprises a part of the n⁻-type well region 3 surrounded by the device isolation layers 6. The device isolation layers 6 may be made of silicon dioxide. The device isolation layers 6 may be formed by a local oxidation of silicon method or a trench isolation method or any other available method.

Figure 4B:
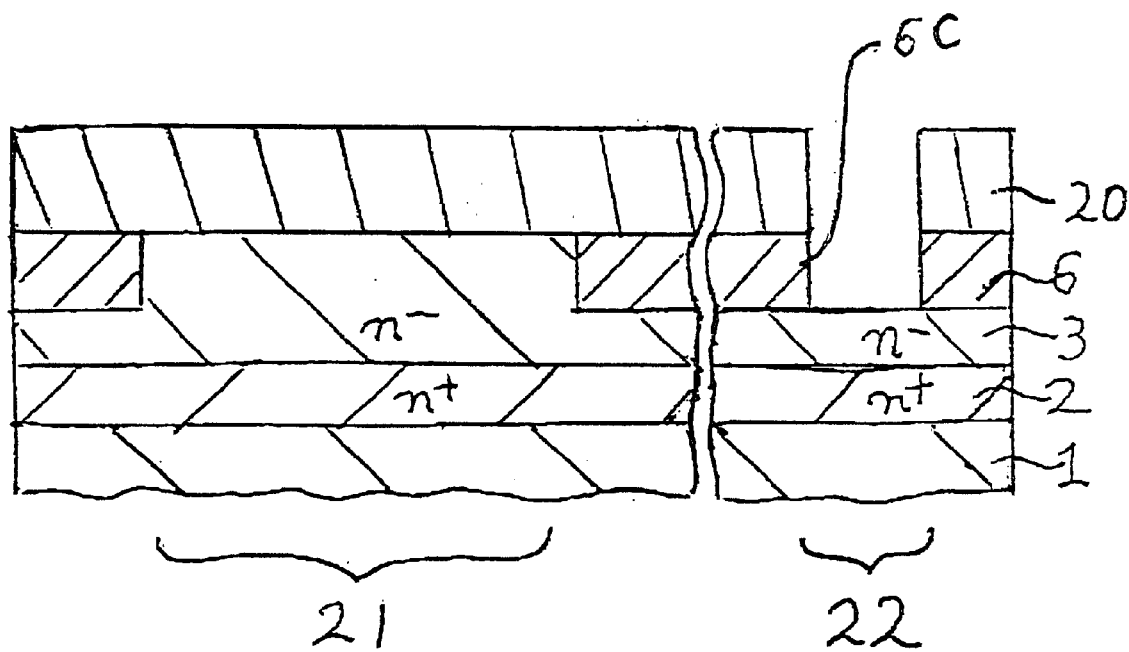

With reference to FIG. 4B, a first resist film is entirely applied on the top surfaces of the device isolation layers 6 and the top surface of the n⁻-type well region 3 which forms the metal oxide semiconductor field effect transistor region 21. A first lithography process is carried out for pattering the first resist film to form a first resist mask 20 over the top surfaces of the device isolation layers 6 and the top surface of the n⁻-type well region 3. The first resist mask 20 is used to carry out a first anisotropic etching process for selectively etching the device isolation layers 6, thereby to form a fourth contact hole 6c in the device isolation layers 6, wherein the fourth contact hole 6c penetrates the device isolation layer 6 and reaches a top surface of the n⁻-type well region 3. As a result, a p-n junction diode region 22 is defined which is self-aligned to the fourth contact hole 6c. Namely, the p-n junction diode region 22 comprises a shown top surface of the n⁻-type well region 3, which is shown through and positioned under the fourth contact hole 6c. In this embodiment, the device isolation layer 6 comprise an $SiO_2$ based layer, for which reason the above anisotropic etching may be carried out by use of a reaction gas of $CHF_4$ or $CHF_3$. Any types of the above anisotropic etching, for example, a dry etching is available provided that a sufficient high selectivity and a sufficiently high anisotropy are obtained to form the fourth contact hole 6c in the device isolation layer 6. The anisotropic etching by use of the first resist mask 20 is discontinued just when the fourth contact hole 6c reaches the top surface of the n⁻-type well region 3 and the p-n junction diode 22 is defined.

Figure 4C:
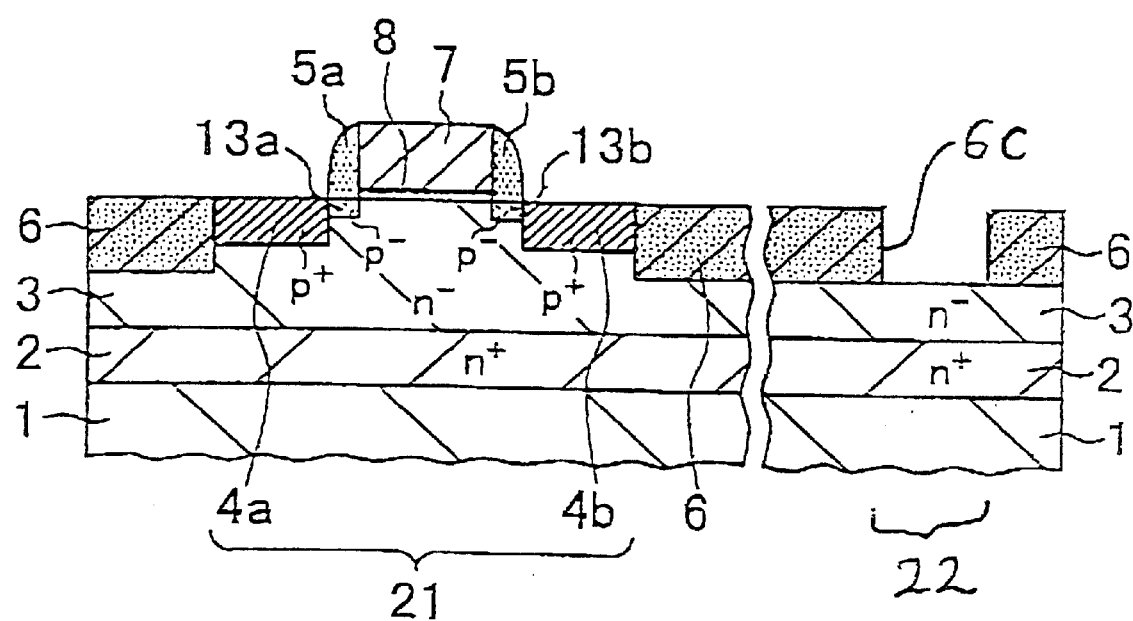

With reference to FIG. 4C, the used first resist mask 20 is removed. In the metal oxide semiconductor field effect transistor region 21, a gate insulation film 8 is selectively provided on the top surface of the n⁻-type well region 3. A gate electrode 7 is provided on the gate insulation film 8. A pair of p⁻-type lightly doped diffusion regions 13a and 13b are selectively formed in upper regions of the n⁻-type well region 3 by a self-alignment technique, wherein the p⁻-type lightly doped diffusion regions 13a and 13b are self-aligned to the gate electrode 7. Side wall insulation films 5a and 5b are formed on side walls of the gate electrode 107.

An ion-implantation process is then carried out by use of the gate electrode 7 and the side wall insulation films 5a and 5b as masks for selectively introducing a p-type impurity into only the metal oxide semiconductor field effect transistor region 21. As a result, in the metal oxide semiconductor field effect transistor region 21, source and drain p+-type diffusion regions 4a and 4b are selectively formed in the n⁻-type well region 3 so that the source and drain p+-type diffusion regions 4a and 4b are self-aligned to the gate electrode 7 and the side wall insulation films 5a and 5b, whereby lightly doped diffusion regions 13a and 13b remain only under the side wall insulation films 5a and 5b. The source and drain p+-type diffusion regions 4a and 4b are deeper than the lightly doped diffusion regions 13a and 13b. In the metal oxide semiconductor field effect transistor region 21, a source region comprises the p+-type diffusion region 4a and the lightly doped diffusion region 13a, whilst a drain region comprises the p+-type diffusion region 4b and the lightly doped diffusion region 13b.

Figure 4D:
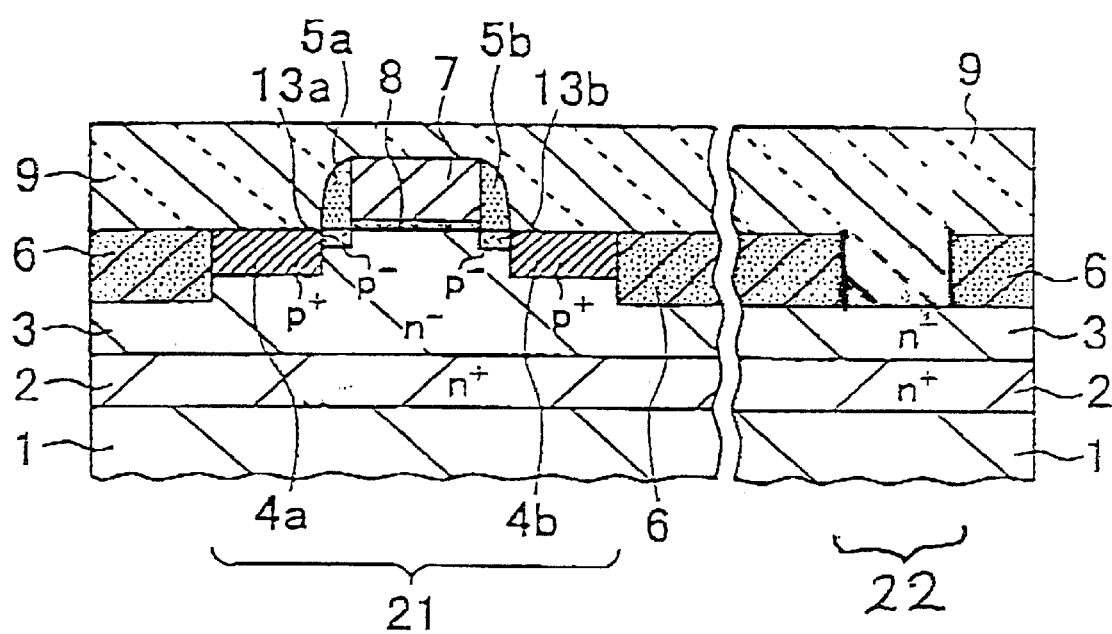

With reference to FIG. 4D, an inter-layer insulator 9 is further formed entirely which extends over the device isolation layers 6, the side wall insulation films 5a and 5b, the gate electrode 7 and the source and drain p+-type diffusion regions 4a and 4b and further within the fourth contact hole 6c. The inter-layer insulator 9 may comprise a boro-phospho silicate glass film.

Figure 4E:
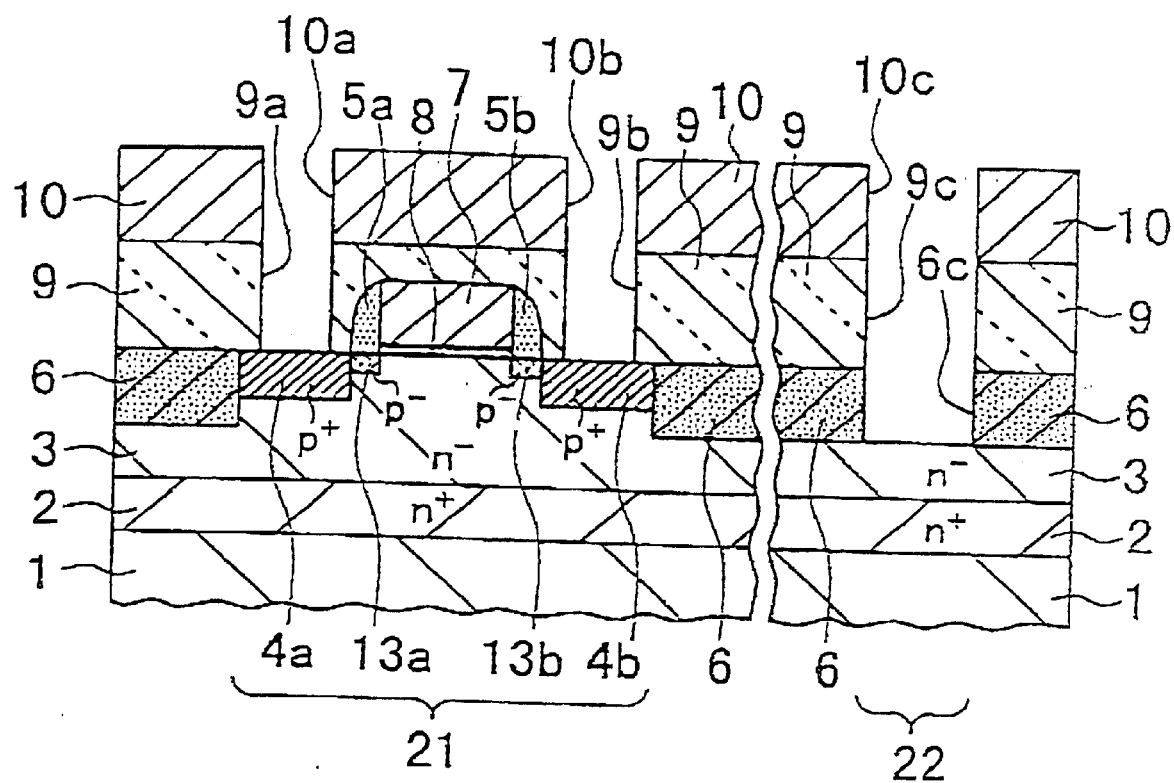

With reference to FIG. 4E, a second resist film is entirely formed on the inter-layer insulator 9. A second lithography is carried out to pattern the second photo-resist film to form a second resist mask 10 having first, second and third openings 10a, 10b and 10c on the inter-layer insulator 9, wherein the third opening 10c is positioned over the fourth contact hole 6c. The second resist mask 10 is used to carry out a selective anisotropic etching to the inter-layer insulator 9, whereby first, second and third contact holes 9a, 9b and 9c are formed in the inter-layer insulator 9 so that the first and second contact holes 9a and 9b reach the source and drain p+-type diffusion regions 4a and 4b, whilst the third contact hole 9c reaches the fourth contact hole 6c so that the third and fourth contact holes 9c and 6c form a single contact hole which penetrates the inter-layer insulator 9 and the device isolation layer 6 and reaches the part of the top surface of the n⁻-type well region 3. Namely, the single contact hole comprising the third and fourth contact holes 9c and 6c reaches the p-n junction diode region 22. In this embodiment, the inter-layer insulator 9 comprises an $SiO_2$ based layer, for which reason the above anisotropic etching may be carried out by use of the reaction gas of $CHF_4$ or $CHF_3$. Any types of the above anisotropic etching, for example, a dry etching is available provided that a sufficient high selectivity and a sufficiently high anisotropy are obtained to form the first, second and third contact holes 9a, 9b and 9c in the inter-layer insulator 9. The anisotropic etching by use of the second resist mask 10 is discontinued just when the first and second contact holes 9a and 9b reach the top surfaces of the source and drain p+-type diffusion regions 4a and 4b and also the third contact hole 9c is connected to the fourth contact hole 6c already formed in the device isolation layer 6.

Figure 4F:
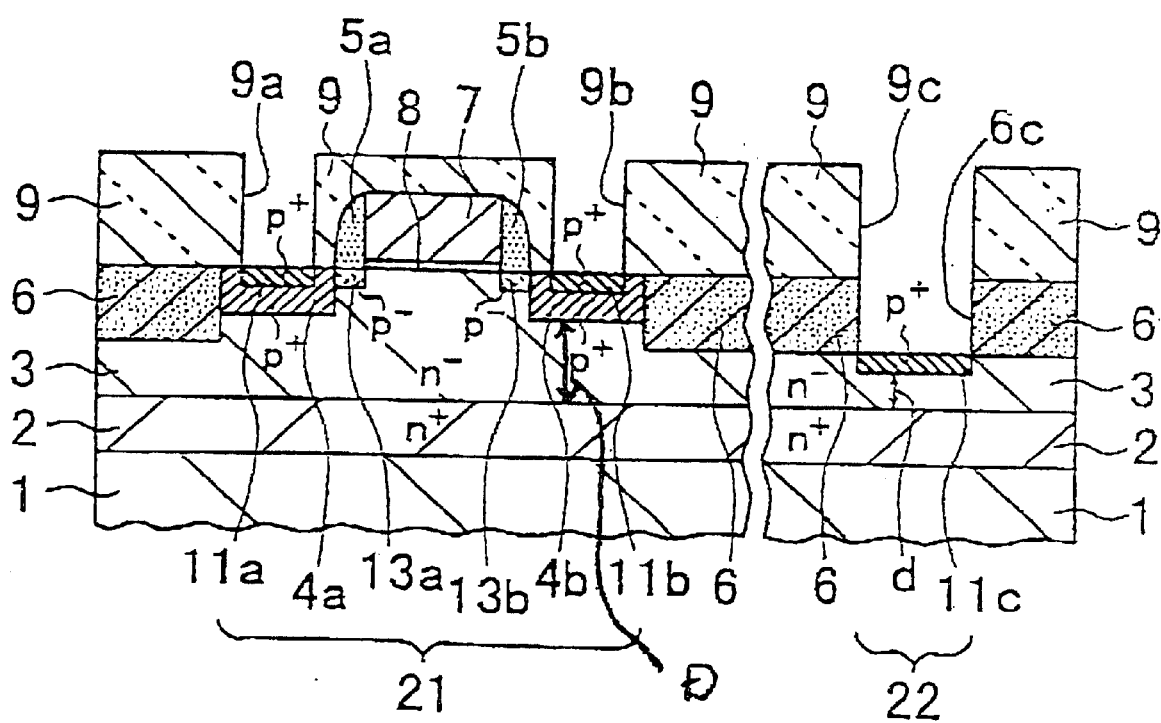

With reference to FIG. 4F, the used second resist mask 10 is removed. The inter-layer insulator 9 having the contact holes 9a, 9b and 9c are used as a mask to carry out an ion-implantation of a p-type impurity, for example, boron for selectively introducing the p-type impurity into selected upper regions of the source and drain p+-type diffusion regions 4a and 4b, thereby to form first and second p+-type contact regions 11a and 11b in the selected upper regions of the source and drain p+-type diffusion regions 4a and 4b, wherein the first and second p+-type contact regions 11a and 11b are self-aligned to the first and second contact holes 9a and 9b. This ion-implantation also introduces the p-type impurity into the p-n junction diode region 22 of the n⁻-type well region 3 to form a third p+-type contact region 11c on the p-n junction diode region 22 and in a selected upper region of the n⁻-type well region 3, wherein the third p+-type contact region 11c is self-aligned to the third contact hole 9c. The first, second and third p+-type contact regions 11a, 11b and 11c have the same thickness The third p+-type contact region 11c has an interface with the n⁻-type well region 3. The p-n junction diode has a p-n junction which comprises the interface between the third p+-type contact region 11c and the n⁻-type well region 3.

As described above, the bottom level of the device isolation layer 6 is deeper than the bottom level of the source and drain p+-type diffusion regions 4a and 4b. The third p+-type contact region 11c is positioned directly under the fourth contact hole 6c. The bottom level of the device isolation layer 6 corresponds to the top level of the third p+-type contact region 11c. The bottom level of the third p+-type contact region 11c is thus deeper than the bottom level of the device isolation layer 6. Therefore, the bottom level of the third p+-type contact region 11c is thus deeper than the bottom level of the source and drain p+-type diffusion regions 4a and 4b. The bottom level of the n⁻-type well region 3 is uniform over the p-n junction diode region 22 and the metal oxide semiconductor field effect transistor region 21. Therefore, a first distance "d" defined between the p-n junction of the p-n junction diode or the interface between the third p+-type contact region 11c and the bottom of the n⁻-type well region 3 is smaller than a second distance "D" defined between the bottom of the source and drain p+-type diffusion regions 4a and 4b and the bottom of the n⁻-type well region 3.

In accordance with the novel method of forming the semiconductor device the first distance "d" defined between the p-n junction of the p-n junction diode or the interface between the third p+-type contact region 11c and the bottom of the n⁻-type well region 3 depends upon not only the thicknesses of the third p+-type contact region 11c and the n+-type well region 3 but also the thickness or the depth of the device isolation layer 6. The third p+-type contact region 11c serves as an anode of the p-n junction diode. Namely, the depth of the p-n junction of the p-n junction diode or the bottom level of the third p+-type contact region 11c in the p-n junction diode region 22 may be decided upon the depth of the bottom level of the device isolation layer 6 or the thickness of the device isolation layer 6 independently from the depth of the source and drain p+-type diffusion regions 4a and 4b in the metal oxide semiconductor field effect transistor region 21. The depth of the source and drain p+-type diffusion regions 4a and 4b and the depth of the n⁻-type well region 3 are decided in consideration of the required dimensions and performances of the metal oxide semiconductor field effect transistor formed in the metal oxide semiconductor field effect transistor region 21. However, the first distance "d" in the p-n junction diode region 22 may be decided independently from the required dimensions and performances of the metal oxide semiconductor field effect transistor formed in the metal oxide semiconductor field effect transistor region 21. A breakdown voltage of the p-n junction diode formed between the p+-type region 11c and the n--type well region 3 depends upon the first distance "d" in the p-n junction diode region 22. Namely, the breakdown voltage of the p-n junction diode in the p-n junction diode region 22 may be decided independent from the required dimensions and performances of the metal oxide semiconductor field effect transistor formed in the metal oxide semiconductor field effect transistor region 21. Since the first distance "d" in the p-n junction diode region 22 is adjustable by controlling the thickness of the device isolation layer 6 independently from the requirement for designing the metal oxide semiconductor field effect transistor. Namely, the first distance "d" in the p-n junction diode region 22 may be reduced for sufficiently reducing the breakdown voltage of the p-n junction diode in the p-n junction diode region 22 independently from the requirement for designing the metal oxide semiconductor field effect transistor. The reason why the p-n junction diode is formed in the p-n junction diode region 22 is to cause a breakdown of the p-n junction diode so as to prevent the metal oxide semiconductor field effect transistor from being broken due to the electrostatic discharge or the surge current and voltage. Since the breakdown voltage of the p-n junction diode formed in the p-n junction diode region 22 is reduced, then this allows that the p-n junction diode shows a certain breakdown to prevent the metal oxide semiconductor field effect transistor from being broken by the electrostatic discharge or the surge current and voltage applications.

Figure 4G:
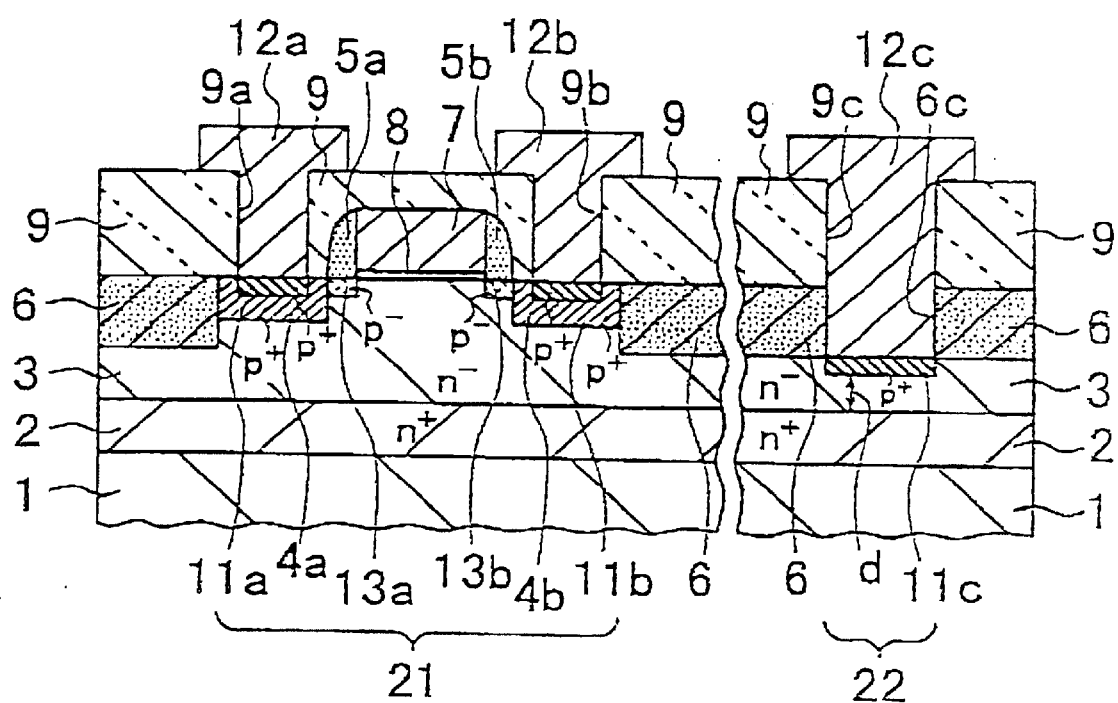

With reference to FIG. 4G, first, second and third electrodes 12a, 12b and 12c are selectively formed by the known technique in the first, second, third and fourth contact holes 9a, 9b, 9c and 6c and on the inter-layer insulator 9 The first electrode 12a is formed in the first contact hole 9a so that the bottom of the first electrode 12a is in contact with the first p+-type contact region 11a. The second electrode 12b is formed in the second contact hole 9b so that the bottom of the second electrode 12b is in contact with the second p+-type contact region 11b. The third electrode 12c is formed in the third and fourth contact holes 9c and 6c so that the bottom of the third electrode 12c is in contact with, the third p+-type contact region 11c.

Even illustration is omitted, a further inter-layer insulator and an interconnection as well as a passivation layer may be formed, whereby the fabrication of the semiconductor device is completed.

As described above the bottom level of the device isolation layer 6 is deeper than the bottom level of the source and drain p+-type diffusion regions 4a and 4b. The third p+-type contact region 11c is positioned directly under the fourth contact hole 6c. The bottom level of the device isolation layer 6 corresponds to the top level of the third p+-type contact region 11c. The bottom level of the third p+-type contact region 11c is thus deeper than the bottom level of the device isolation layer 6. Therefore, the bottom level of the third p+-type contact region 11c is thus deeper than the bottom level of the source and drain p+-type diffusion regions 4a and 4b The bottom level of the n⁻-type well region 3 is uniform over the p-n junction diode region 22 and the metal oxide semiconductor field effect transistor region 21. Therefore, a first distance "d" defined between the p-n junction of the p-n junction diode or the interface between the third p+-type contact region 11c and the bottom of the n⁻-type well region 3 is smaller than a second distance "D" defined between the bottom of the source and drain p+-type difusion regions 4a and 4b and the bottom of the n⁻-type well region 3.

In accordance with the novel method of forming the semiconductor device, the first distance "d" defined between the p-n junction of the p-n junction diode or the interface between the third p+-type contact region 11c and the bottom of the n⁻-type well region 3 depends upon not only the thicknesses of the third p+-type contact region 11c and the n+-type well region 3 but also the thickness or the depth of the device isolation layer 6. The third p+-type contact region 11c serves as an anode of the p-n junction diode. Namely, the depth of the p-n junction of the p-n junction diode or the bottom level of the third p+-type contact region 11c in the p-n junction diode region 22 may be decided upon the depth of the bottom level of the device isolation layer 6 or the thickness of the device isolation layer 6 independently from the depth of the source and drain p+-type diffusion regions 4a and 4b in the metal oxide semiconductor field effect transistor region 21. The depth of the source and drain p+-type diffusion regions 4a and 4b and the depth of the n⁻-type well region 3 are decided in consideration of the required dimensions and performances of the metal oxide semiconductor field effect transistor formed in the metal oxide semiconductor field effect transistor region 21. However, the first distance "d" in the p-n junction diode region 22 may be decided independently from the required dimensions and performances of the metal oxide semiconductor field effect transistor formed in the metal oxide semiconductor field effect transistor region 21. A breakdown voltage of the p-n junction diode formed between the p+-type region 11c and the n⁻-type well region 3 depends upon the first distance "d" in the p-n junction diode region 22. Namely, the breakdown voltage of the p-n junction diode in the p-n junction diode region 22 may be decided independent from the required dimensions and performances of the metal oxide semiconductor field effect transistor formed in the metal oxide semiconductor field effect transistor region 21. Since the first distance "d" in the p-n junction diode region 22 is adjustable by controlling the thickness of the device isolation layer 6 independently from the requirement for designing the metal oxide semiconductor field effect transistor. Namely, the first distance "d" in the p-n junction diode region 22 may be reduced for sufficiently reducing the breakdown voltage of the p-n junction diode in the p-n junction diode region 22 independently from the requirement for designing the metal oxide semiconductor field effect transistor. The reason why the p-n junction diode is formed in the p-n junction diode region 22 is to cause a breakdown of the p-n junction diode so as to prevent the metal oxide semiconductor field effect transistor from being broken due to the electrostatic discharge or the surge current and voltage. Since the breakdown voltage of the p-n junction diode formed in the p-n junction diode region 22 is reduced, then this allows that the p-n junction diode shows a certain breakdown to prevent the metal oxide semiconductor field effect transistor from being broken by the electrostatic discharge or the surge current and voltage applications.

As in the embodiment, the p-channel metal oxide semiconductor field effect transistor is formed in the n-well region. It is, of course, possible that the n-channel metal oxide semiconductor field effect transistor is formed in the p-well region.

As in the embodiment, the source and drain diffusion regions have lightly doped drain structures. It is, of course, possible that the source and drain diffusion regions are free of lightly doped drain structures or may have any other structures.

The p-n junction diode and the source and drain diffusion regions of the metal oxide semiconductor field effect transistor are formed in the well region over the epitaxial layer over the silicon substrate. It is, of course, possible that the p-n junction diode and the source and drain diffusion regions of the metal oxide semiconductor field effect transistor are formed in upper regions of the silicon substrate without forming the well region and the epitaxial layer. It is also possible to change the epitaxial layer into a pseudo epitaxial layer which is formed by an ion-implantation into an upper region of the silicon substrate.

As in the above embodiment, the p-n junction diode is provided for protecting the metal oxide semiconductor field effect transistor from being broken due to the electrostatic discharge or the surge current and voltage. It is, however, possible that in place of the metal oxide semiconductor field effect transistor, any other semiconductor device having at least a diffusion region is formed and the p-n junction diode protects the other semiconductor device from being broken due to the electrostatic discharge or the surge current and voltage. Namely, the present invention may be applicable to the other semiconductor device having at least a diffusion region than the metal oxide semiconductor field effect transistor.

Fourth Embodiment

A fourth embodiment according to the present invention will be described in detail with reference to the drawings. FIGS 5A through 5H are fragmentary cross sectional elevation views illustrative of a novel semiconductor device provided with both a metal oxide semiconductor field effect transistor and an improved p-n junction diode in sequential steps involved in a novel fabrication method in accordance with the fourth embodiment according to the present invention. The semiconductor device has a metal oxide semiconductor field effect transistor region 21 and a p-n junction diode region 22.

Figure 5A:
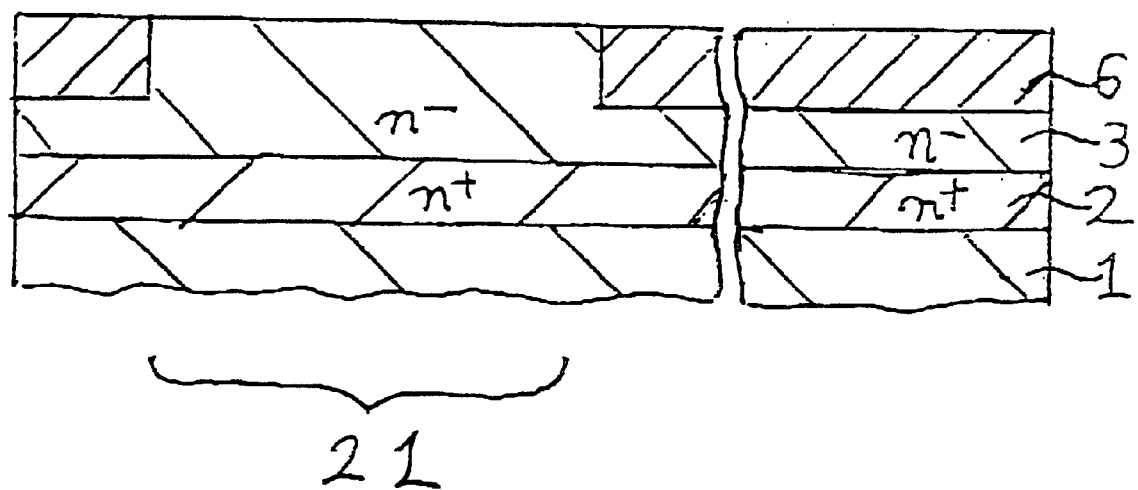
FIGS. 5A through 5H are fragmentary cross sectional elevation views illustrative of a novel semiconductor device provided with both a metal oxide semiconductor field effect transistor and an improved p-n junction diode in sequential steps involved in a novel fabrication method in accordance with the fourth embodiment according to the present invention.

With reference to FIG. 5A, an n+-type epitaxial layer 2 is formed on a top surface of a silicon substrate 1. An n⁻-type well region 3 is selectively formed in an upper region of the n+-type epitaxial layer 2. Device isolation layers 6 are selectively formed in upper regions of the n⁻-type well region 3, so that the device isolation layers 6 define only a metal oxide semiconductor field effect transistor region 21. The metal oxide semiconductor field effect transistor region 21 comprises a part of the n⁻-type well region 3 surrounded by the device isolation layers 6. The device isolation layers 6 may be made of silicon dioxide. The device isolation layers 6 may be formed by a local oxidation of silicon method or a trench isolation method or any other available method.

Figure 5B:
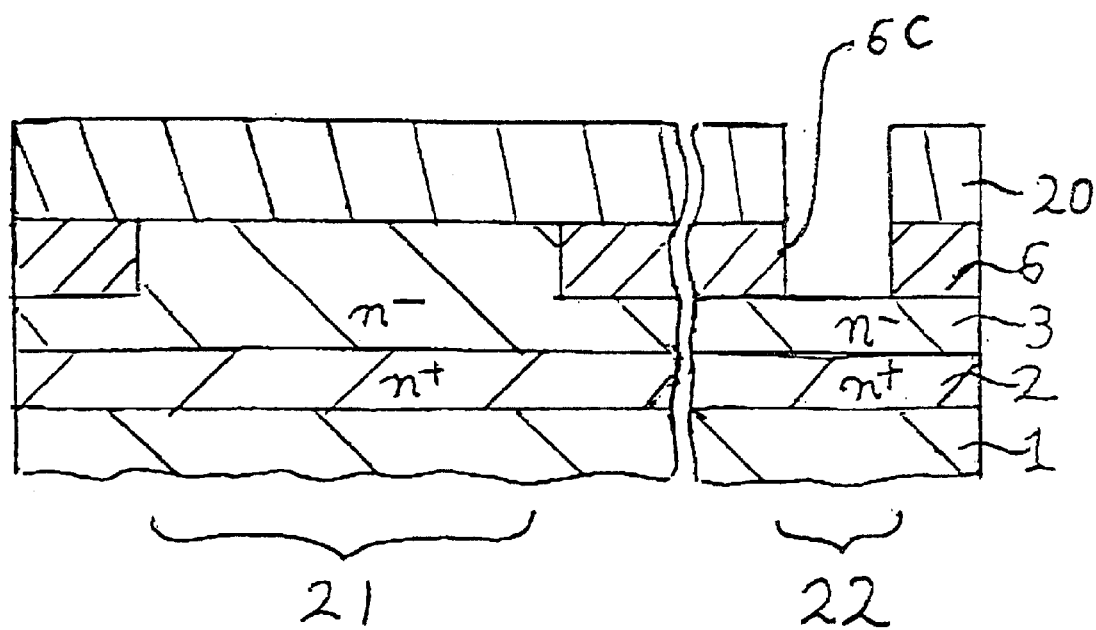

With reference to FIG. 5B, a first resist film is entirely applied on the top surfaces of the device isolation layers 6 and the top surface of the n⁻-type well region 3 which forms the metal oxide semiconductor field effect transistor region 21. A first lithography process is carried out for pattering the first resist film to form a first resist mask 20 over the top surfaces of the device isolation layers 6 and the top surface of the n⁻-type well region 3 The first resist mask 20 is used to carry out a first anisotropic etching process for selectively etching the device isolation layers 6, thereby to form a fourth contact hole 6c in the device isolation layers 6, wherein the fourth contact hole 6c penetrates the device isolation layer 6 and reaches a top surface of the n⁻-type well region 3. As a result, a p-n junction diode region 22 is defined which is self-aligned to the fourth contact hole 6c. Namely, the p-n junction diode region 22 comprises a shown top surface of the n⁻-type well region 3, which is shown through and positioned under the fourth contact hole 6c. In this embodiment, the device isolation layer 6 comprise an $SiO_2$ based layer, for which reason the above anisotropic etching may be carried out by use of a reaction gas of $CHF_4$ or $CHF_3$. Any types of the above anisotropic etching, for example, a dry etching is available provided that a sufficient high selectivity and a sufficiently high anisotropy are obtained to form the fourth contact hole 6c in the device isolation layer 6. The anisotropic etching by use of the first resist mask 20 is discontinued just when the fourth contact hole 6c reaches the top surface of the n⁻-type well region 3 and the p-n junction diode 22 is defined.

Figure 5C:
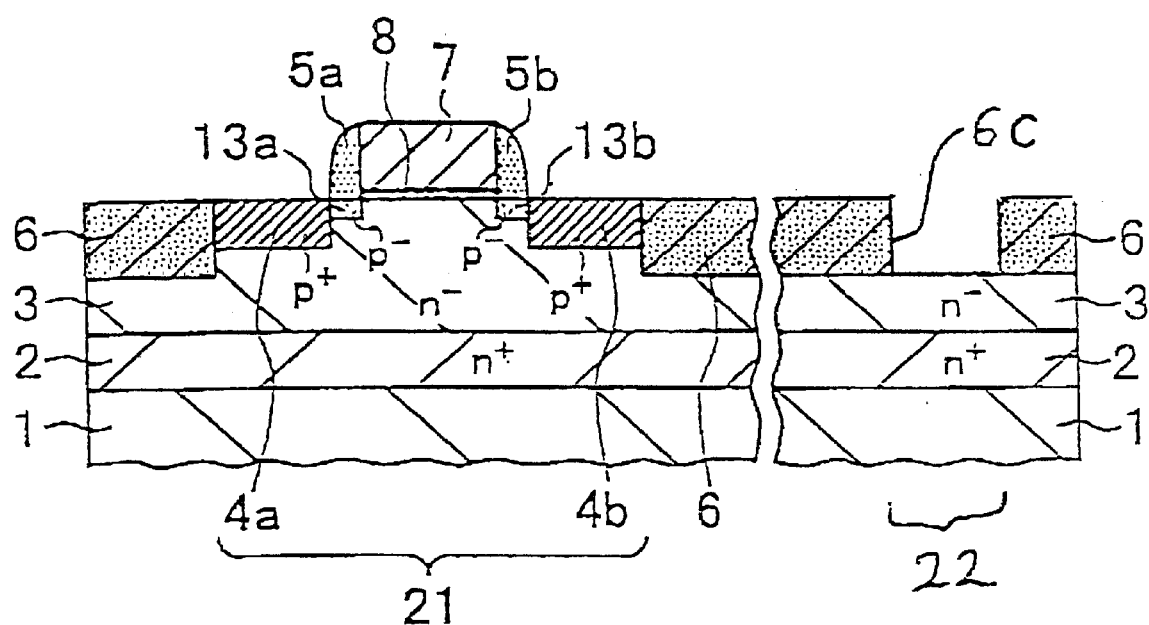

With reference to FIG. 5C, the used first resist mask 20 is removed. In the metal oxide semiconductor field effect transistor region 21, a gate insulation film 8 is selectively provided on the top surface of the n⁻-type well region 3. A gate electrode 7 is provided on the gate insulation film 8. A pair of p⁻-type lightly doped diffusion regions 13a and 13b are selectively formed in upper regions of the n⁻-type well region 3 by a self-alignment technique, wherein the p⁻-type lightly doped diffusion regions 13a and 13b are self-aligned to the gate electrode 7. Side wall insulation films 5a and 5b are formed on side walls of the gate electrode 107.

An ion-implantation process is then carried out by use of the gate electrode 7 and the side wall insulation films 5a and 5b as masks for selectively introducing a p-type impurity into only the metal oxide semiconductor field effect transistor region 21. As a result, in the metal oxide semiconductor field effect transistor region 21, source and drain p+-type diffusion regions 4a and 4b are selectively formed in the n⁻-type well region 3 so that the source and drain p+-type diffusion regions 4a and 4b are self-aligned to the gate electrode 7 and the side wall insulation films 5a and 5b, whereby lightly doped diffusion regions 13a and 13b remain only under the side wall insulation films 5a and 5b. The source and drain p+-type diffusion regions 4a and 4b are deeper than the lightly doped diffusion regions 13a and 13b. In the metal oxide semiconductor field effect transistor region 21, a source region comprises the p+-type diffusion region 4a and the lightly doped diffusion region 13a, whilst a drain region comprises the p+-type diffusion region 4b and the lightly doped diffusion region 13b.

Figure 5D:
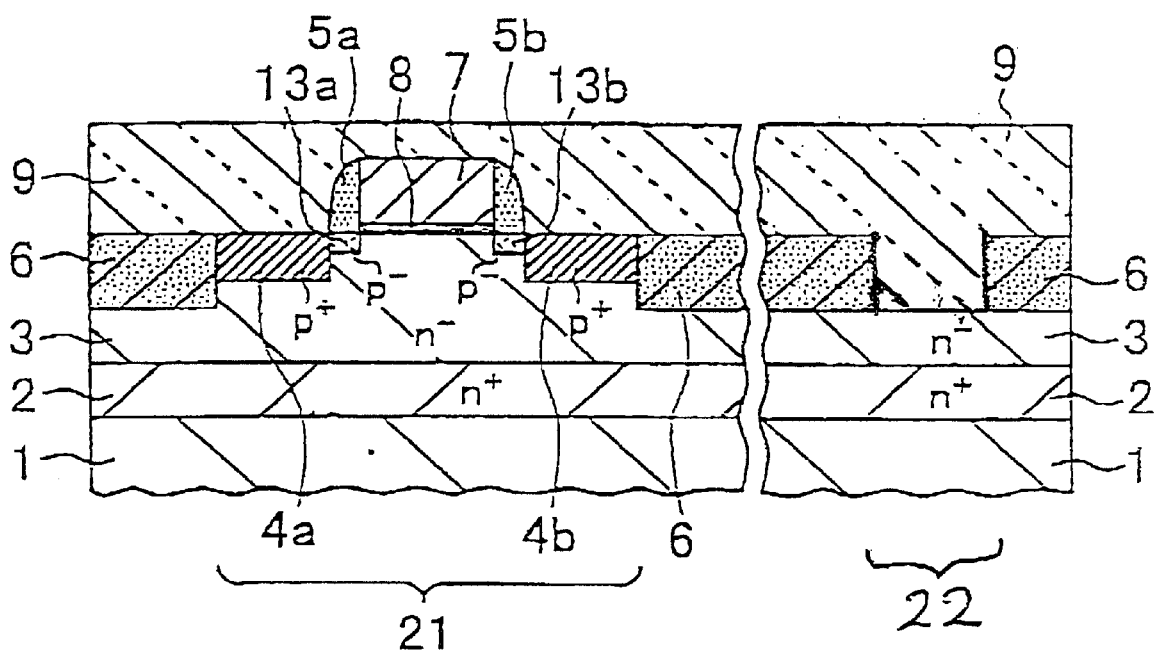

With reference to FIG. 5D, an inter-layer insulator 9 is further formed entirely which extends over the device isolation layers 6, the side wall insulation films 5a and 5b, the gate electrode 7 and the source and drain p+-type diition regions 4a and 4b and further within the fourth contact hole 6c. The inter-layer insulator 9 may comprise a boro-phospho silicate glass film.

Figure 5E:
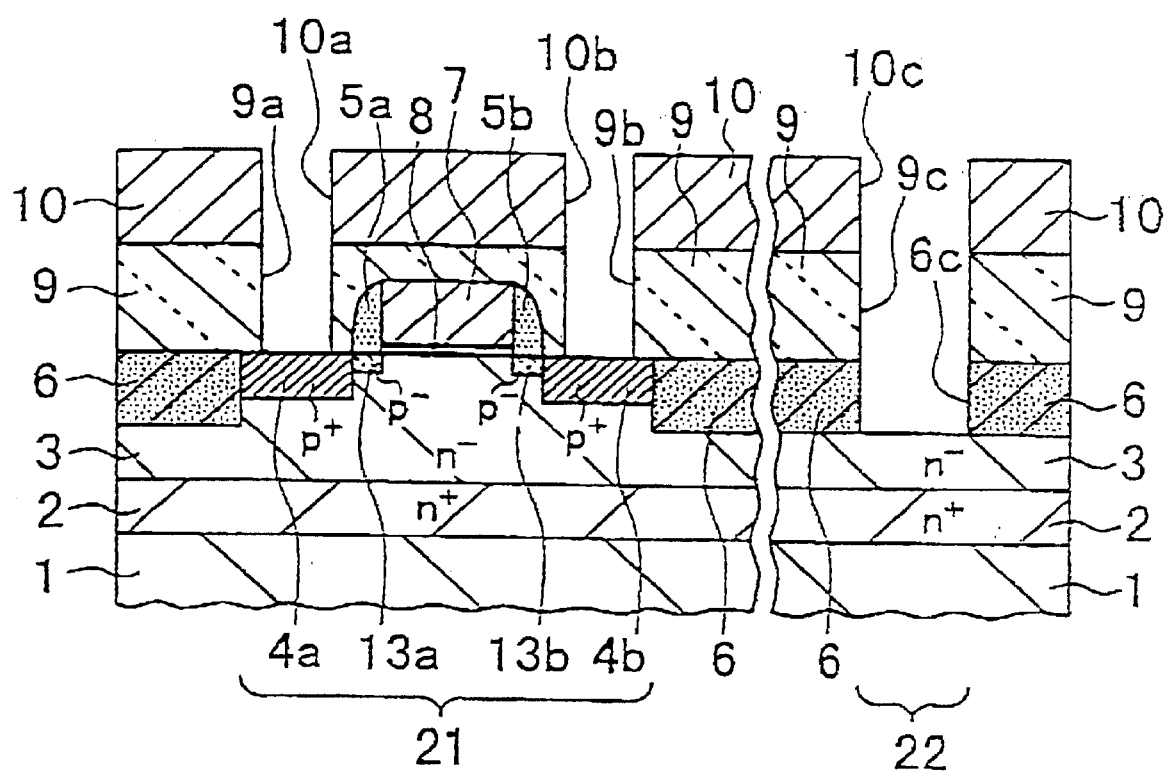

With reference to FIG. 5E, a second resist film is entirely formed on the inter-layer insulator 9. A second lithography is carried out to pattern the second photo-resist film to form a second resist mask 10 having first, second and third openings 10a, 10b and 10c on the inter-layer insulator 9, wherein the third opening 10c is positioned over the fourth contact hole 6c. The second resist mask 10 is used to carry out a selective anisotropic etching to the inter-layer insulator 9, whereby first, second and third contact holes 9a, 9b and 9c are formed in the inter-layer insulator 9 so that the first and second contact holes 9a and 9b reach the source and drain p+-type diffusion regions 4a and 4b, whilst the third contact hole 9c reaches the fourth contact hole 6c so that the third and fourth contact holes 9c and 6c form a single contact hole which penetrates the inter-layer insulator 9 and the device isolation layer 6 and reaches the part of the top surface of the n⁻-type well region 3. Namely, the single contact hole comprising the third and fourth contact holes 9c and 6c reaches the p-n junction diode region 22. In this embodiment, the inter-layer insulator 9 comprises an $SiO_2$ based layer, for which reason the above anisotropic etching may be carried out by use of the reaction gas of $CHF_4$ or $CHF_3$. Any types of the above anisotropic etching, for example, a dry etching is available provided that a sufficient high selectivity and a sufficiently high anisotropy are obtained to form the first, second and third contact holes 9a, 9b and 9c in the inter-layer insulator 9. The anisotropic etching by use of the second resist mask 10 is discontinued just when the first and second contact holes 9a and 9b reach the top surfaces of the source and drain p+-type diffusion regions 4a and 4b and also the third contact hole 9c is connected to the fourth contact hole 6c already formed in the device isolation layer 6.

Figure 5F:
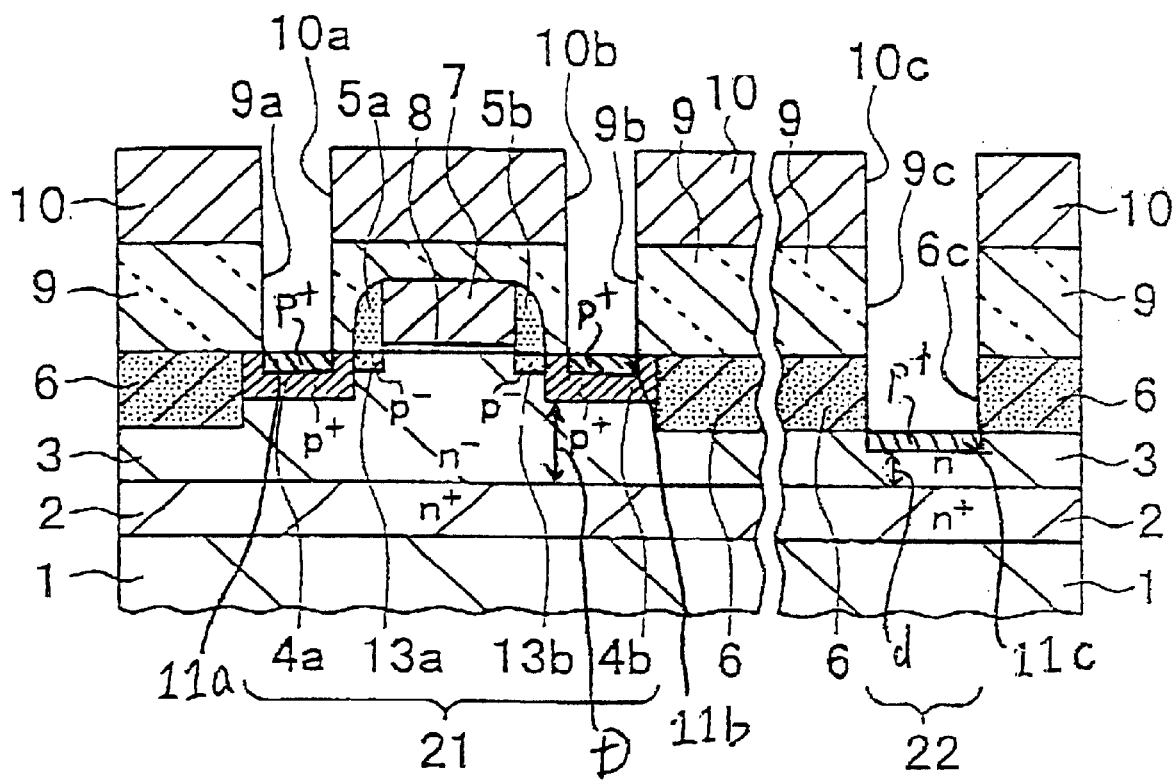
Figure 5G:
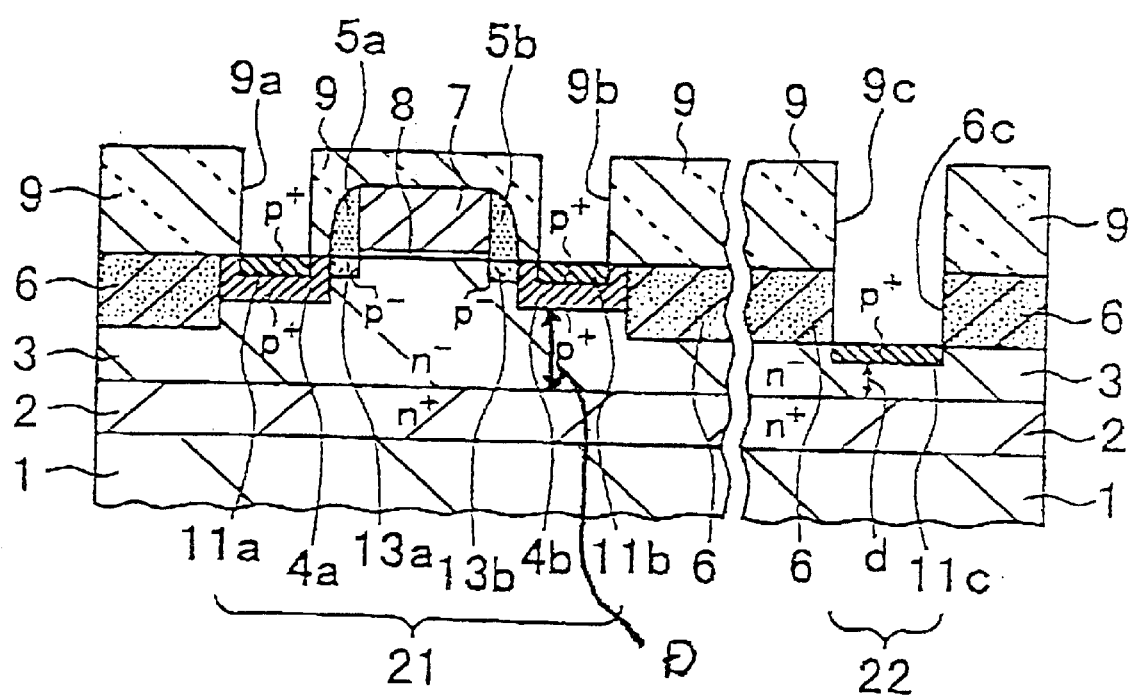
Figure 5H:
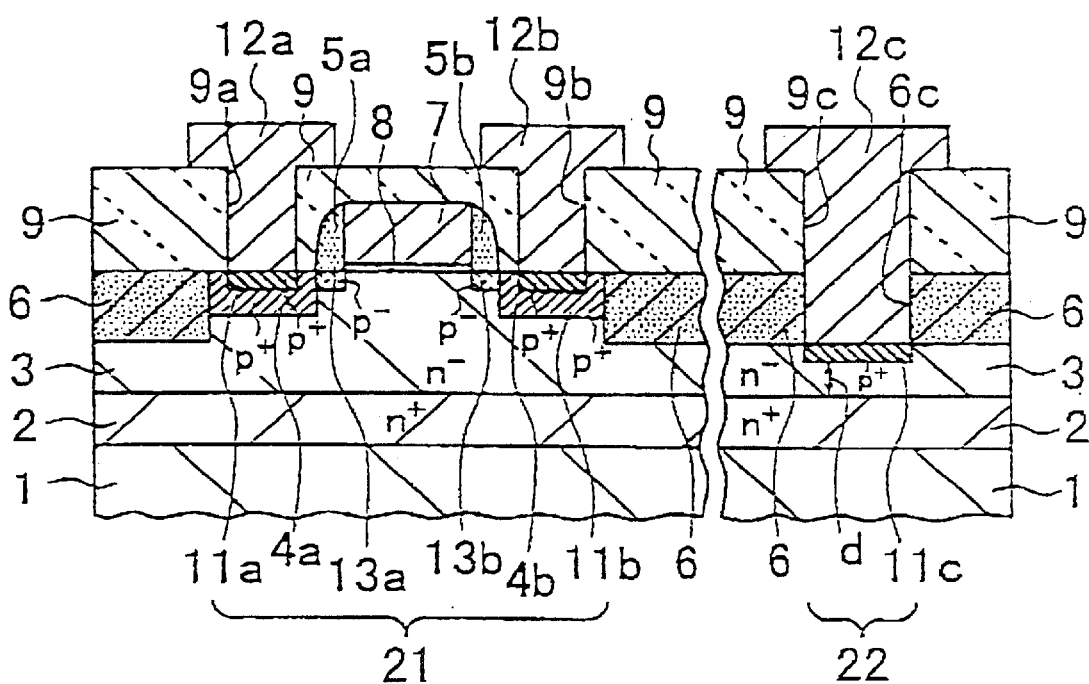

With reference to FIG. 5F, the second resist mask 10 is still used as a mask to carry out an ion-implantation of a p-type impurity, for example, boron for selectively introducing the p-type impurity into selected upper regions of the source and drain p+-type diffusion regions 4a and 4b, thereby to form first and second p+-type contact regions 11a and 11b in the selected upper regions of the source and drain p+-type diffusion regions 4a and 4b, wherein the first and second p+-type contact regions 11a and 11b are self-aligned to the first and second contact holes 9a and 9b. This ion-implantation also introduces the p-type impurity into the p-n junction diode region 22 of the n⁻-type well region 3 to form a third p+-type contact region 11c on the p-n junction. diode region 22 and in a selected upper region of the n⁻-type well region 3, wherein the third p+-type contact region 11c is self-aligned to the third contact hole 9c. The first, second and third p+-type contact regions 11a, 11b and 11c have the same thickness The third p+-type contact region 11c has an interface with the n⁻-type well region 3. The p-n junction diode has a p-n junction which comprises the interface between the third p+-type contact region 11c and the n⁻-type well region 3.

As described above, the bottom level of the device isolation layer 6 is deeper than the bottom level of the source and drain p+-type diffusion regions 4a and 4b. The third p+-type contact region 11c is positioned directly under the fourth contact hole 6c. The bottom level of the device isolation layer 6 corresponds to the top level of the third p+-type contact region 11c. The bottom level of the third p+-type contact region 11c is thus deeper than the bottom level of the device isolation layer 6. Therefore, the bottom level of the third p+-type contact region 11c is thus deeper than the bottom level of the source and drain p+-type diffusion regions 4a and 4b. The bottom level of the n⁻-type well region 3 is uniform over the p-n junction diode region 22 and the metal oxide semiconductor field effect transistor region 21. Therefore, a first distance "d" defined between the p-n junction of the p-n junction diode or the interface between the third p+-type contact region 11c and the bottom of the n⁻-type well region 3 is smaller than a second distance "D" defined between the bottom of the source and drain p+-type diffusion regions 4a and 4b and the bottom of the n⁻-type well region 3.

In accordance with the novel method of forming the semiconductor device, the first distance "d" defined between the p-n junction of the p-n junction diode or the interface between the third p+-type contact region 11c and the bottom of the n⁻-type well region 3 depends upon not only the thickness of the third p+-type contact region 11c and the n+-type well region 3 but also the thickness or the depth of the device isolation layer 6. The third p+-type contact region 11c serves as an anode of the p-n junction diode. Namely, the depth of the p-n junction of the p-n junction diode or the bottom level of the third p+-type contact region 11c in the p-n junction diode region 22 may be decided upon the depth of the bottom level of the device isolation layer 6 or the thickness of the device isolation layer 6 independently from the depth of the source and drain p+-type diffusion regions 4a and 4b in the metal oxide semiconductor field effect transistor region 21. The depth of the source and drain p+-type diffusion regions 4a and 4b and the depth of the n⁻-type well region 3 are decided in consideration of the required dimensions and performances of the metal oxide semiconductor field effect transistor formed in the metal oxide semiconductor field effect transistor region 21. However, the first distance "d" in the p-n junction diode region 22 may be decided independently from the required dimensions and performances of the metal oxide semiconductor field effect transistor formed in the metal oxide semiconductor field effect transistor region 21. A breakdown voltage of the p-n junction diode formed between the p+-type region 11c and the n--type well region 3 depends upon the first distance "d" in the p-n junction diode region 22. Namely, the breakdown voltage of the p-n junction diode in the p-n junction diode region 22 may be decided independent from the required dimensions and performances of the metal oxide semiconductor field effect transistor formed in the metal oxide semiconductor field effect transistor region 21. Since the first distance "d" in the p-n junction diode region 22 is adjustable by controlling the thickness of the device isolation layer 6 independently from the requirement for designing the metal oxide semiconductor field effect transistor Namely, the first distance "d7" in the p-n junction diode region 22 may be reduced for sufficiently reducing the breakdown voltage of the p-n junction diode in the p-n junction diode region 22 independently from the requirement for designing the metal oxide semiconductor field effect transistor. The reason why the p-n junction diode is formed in the p-n junction diode region 22 is to cause a breakdown of the p-n junction diode so as to prevent the metal oxide semiconductor field effect transistor from being broken due to the electrostatic discharge or the surge current and voltage. Since the breakdown voltage of the p-n junction diode formed in the p-n junction diode region 22 is reduced, then this allows that the p-n junction diode shows a certain breakdown to prevent the metal oxide semiconductor field effect transistor from being broken by the electrostatic discharge or the surge current and voltage applications.

With reference to FIG. 4G, the used resist mask 10 is removed.

With reference to FIG. 4H, first, second and third electrodes, 12a, 12b and 12c are selectively formed by the known technique in the firsts second, third and fourth contact holes 9a, 9b, 9c and 6c and on the inter-layer insulator 9. The first electrode 12a is formed in the first contact hole 9a so that the bottom of the first electrode 12a is in contact with the first p+-type contact region 11a. The second electrode 12b is formed in the second contact hole 9b so that the bottom of the second electrode 12b is in contact with the second p+-type contact region 11b. The third electrode 12c is formed in the third and fourth contact holes 9c and 6c so that the bottom of the third electrode 12c is in contact with the third p+-type contact region 11c.

Even illustration is omitted, a further inter-layer insulator and an interconnection as well as a passivation layer may be formed, whereby the fabrication of the semiconductor device is completed.

As described above, the bottom level of the device isolation layer 6 is deeper than the bottom level of the source and drain p+-type diffusion regions 4a and 4b. The third p+-type contact region 11c is positioned directly under the fourth contact hole 6c. The bottom level of the device isolation layer 6 corresponds to the top level of the third p+-type contact region 11c. The bottom level of the third p+-type contact region 11c is thus deeper than the bottom level of the device isolation layer 6. Therefore, the bottom level of the third p+-type contact region 11c is thus deeper than the bottom level of the source and drain p+-type diffusion regions 4a and 4b. The bottom level of the n⁻-type well region 3 is uniform over the p-n junction diode region 22 and the metal oxide semiconductor field effect transistor region 21. Therefore, a first distance "d" defined between the p-n junction of the p-n junction diode or the interface between the third p+-type contact region 11c and the bottom of the n⁻-type well region 3 is smaller than a second distance "D" defined between the bottom of the source and drain p+-type diffusion regions 4a and 4b and the bottom of the n⁻-type well region 3.

In accordance with the novel method of forming the semiconductor device, the first distance "d" defined between the p-n junction of the p-n junction diode or the interface between the third p+-type contact region 11c and the bottom of the n⁻-type well region 3 depends upon not only the thicknesses of the third p+-type contact region 11c and the n+-type well region 3 but also the thickness or the depth of the device isolation layer 6. The third p+-type contact region 11c serves as an anode of the p-n junction diode. Namely, the depth of the p-n junction of the p-n junction diode or the bottom level of the third p+-type contact region 11c in the p-n junction diode region 22 may be decided upon the depth of the bottom level of the device isolation layer 6 or the thickness of the device isolation layer 6 independently from the depth of the source and drain p+-type diffusion regions 4a and 4b in the metal oxide semiconductor field effect transistor region 21. The depth of the source and drain p+-type diffusion regions 4a and 4b and the depth of the n⁻-type well region 3 are decided in consideration of the required dimensions and performances of the metal oxide semiconductor field effect transistor formed in the metal oxide semiconductor field effect transistor region 21. However, the first distance "d" in the p-n junction diode region 22 may be decided independently from the required dimensions and performances of the metal oxide semiconductor field effect transistor formed in the metal oxide semiconductor field effect transistor region 21. A breakdown voltage of the p-n junction diode formed between the p+-type region 11c and the n--type well region 3 depends upon the first distance "d" in the p-n junction diode region 22. Namely, the breakdown voltage of the p-n junction diode in the p-n junction diode region 22 may be decided independent from the required dimensions and performances of the metal oxide semiconductor field effect transistor formed in the metal oxide semiconductor field effect transistor region 21. Since the first distance "d" in the p-n junction diode region 22 is adjustable by controlling the thickness of the device isolation layer 6 independently from the requirement for designing the metal oxide semiconductor field effect transistor. Namely, the first distance "d" in the p-n junction diode region 22 may be reduced for sufficiently reducing the breakdown voltage of the p-n junction diode in the p-n junction diode region 22 independently from the requirement for designing the metal oxide semiconductor field effect transistor. The reason why the p-n junction diode is formed in the p-n junction diode region 22 is to cause a breakdown of the p-n junction diode so as to prevent the metal oxide semiconductor field effect transistor from being broken due to the electrostatic discharge or the surge current and voltage. Since the breakdown voltage of the p-n junction diode formed in the p-n junction diode region 22 is reduced, then this allows that the p-n junction diode shows a certain breakdown to prevent the metal oxide semiconductor field effect transistor from being broken by the electrostatic discharge or the surge current and voltage applications.

As, in the embodiment, the p-channel metal oxide semiconductor field effect transistor is formed in the n-well region. It is, of course, possible that the n-channel metal oxide semiconductor field effect transistor is formed in the p-well region.

As in the embodiment, the source and drain diffusion regions have lightly doped drain structures. It is, of course, possible that the source and drain diffusion regions are free of lightly doped drain structures or may have any other structures.

The p-n junction diode and the source and drain diffusion regions of the metal oxide semiconductor field effect transistor are formed in the well region over the epitaxial layer over the silicon substrate. It is, of course, possible that the p-n junction diode and the source and drain diffusion regions of the metal oxide semiconductor field effect transistor are formed in upper regions of the silicon substrate without forming the well region and the epitaxial layer. It is also possible to change the epitaxial layer into a pseudo epitaxial layer which is formed by an ion-implantation into an upper region of the silicon substrate.

As in the above embodiment, the p-n junction diode is provided for protecting the metal oxide semiconductor field effect transistor from being broken due to the electrostatic discharge or the surge current and voltage. It is, however, possible that in place of the metal oxide semiconductor field effect transistor, any other semiconductor device having at least a diffusion region is formed and the p-n junction diode protects the other semiconductor device from being broken due to the electrostatic discharge or the surge current and voltage. Namely, the present invention may be applicable to the other semiconductor device having at least a diffusion region than the metal oxide semiconductor field effect transistor.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor device having:
   a first semiconductor region of a first conductivity type having a first area and a second area;
   at least a diffusion region of a second conductivity type being provided on said first area and in an upper region of said first semiconductor region; and
   a p-n junction diode provided on said second area of said first semiconductor region, said p-n junction diode having a p-n junction comprising an interface between said first semiconductor region and a first impurity doped region of the second conductivity type selectively provided in an upper region of said first semiconductor region,
   wherein a first distance defined between a first bottom level of said first impurity doped region and a bottom level of said first semiconductor region is smaller than a second distance defined between a second bottom level of said at least diffusion region and said bottom level of said first semiconductor region,
   wherein said first impurity doped region of said p-n junction diode is self-aligned to and exists directly under a first contact hole penetrating a device isolation layer, so that a top level of said first impurity doped region corresponds to a third bottom level of said device isolation layer and which is deeper than said second bottom level of said at least diffusion region and shallower than said first bottom level of said first impurity doped region,
   wherein said first impurity doped region of said p-n junction diode has a first thickness which is thinner than a second thickness of said at least diffusion region,
   wherein at least a second contact hole is further provided directly over a part of said at least diffusion region, and a second impurity doped region is selectively provided in said at least diffusion region and is self-aligned to and exists directly under said second contact hole.

2. The semiconductor device as claimed in claim 1, wherein said second impurity doped regions has substantially the same thickness as said first thickness of said first impurity doped region of said p-n junction diode.

3. The semiconductor device as claimed in claim 1, wherein an inter-layer insulator exists over said field effect transistor on said first area and said device isolation layer over said p-n junction diode on said second area, and said second contact hole penetrates said inter-layer insulator, whilst said first contact hole penetrates not only said inter-layer insulator but also said device isolation layer.

4. The semiconductor device as claimed in claim 1, wherein said first and second impurity doped regions comprise ion-implanted regions.

5. The semiconductor device as claimed in claim 1, wherein said first impurity doped region is lower in impurity concentration than said second impurity doped region.

6. A semiconductor device having:
   a first semiconductor region of a first conductivity type having a first area and a second area;
   a field effect transistor provided on said first area of said first semiconductor region, said field effect transistor also having source and drain diffusion regions of a second conductivity type, said source and drain diffusion regions being provided in upper regions of said first semiconductor region; and
   a p-n junction diode provided on said second area of said first semiconductor region, said p-n junction diode having a p-n junction comprising an interface between said first semiconductor region and a first impurity doped region of the second conductivity type selectively provided in an upper region of said first semiconductor region,
   wherein a bottom first level of said first impurity doped region is deeper than a bottom second level of said source and drain diffusion regions,
   wherein said first impurity doped region of said p-n junction diode is self-aligned to and exists directly under a first contact hole penetrating a device isolation layer, so that a top level of said first impurity doped region corresponds to a third bottom level of said device isolation layer and which is deeper than said second bottom level of said source and drain diffusion regions and shallower than said first bottom level of said first impurity doped region,
   wherein said first impurity doped region of said p-n junction diode has a first thickness which is thinner than a second thickness of said source and drain diffusion regions, wherein second and third contact holes are further provided directly over parts of said source and drain diffusion regions, and second and third impurity doped regions are selectively provided in said source and drain diffusion regions and are self-aligned to and exists directly under said second and third contact holes.

7. the semiconductor device as claimed in claim 1, wherein said second and third impurity doped regions have substantially the same thickness as said first thickness of said first impurity doped region of said p-n junction diode.

8. The semiconductor device as claimed in claim 1, wherein an inter-layer insulator exists over said field effect transistor on said first area and said device isolation layer over said p-n junction diode on said second area, and said second and third contact holes penetrate said inter-layer insulator, whilst said first contact hole penetrates not only said inter-layer insulator but also said device isolation layer.

9. The semiconductor device as claimed in claim 1, wherein said first, second and third impurity doped regions comprise ion-implanted regions.

10. The semiconductor device as claimed in claim 1, wherein said first impurity doped region is lower in impurity concentration than said second and third impurity doped regions.

* * * * *